(12) United States Patent
Takeda

(10) Patent No.: US 11,769,849 B2
(45) Date of Patent: Sep. 26, 2023

(54) PHOTODETECTOR

(71) Applicant: Nippon Telegraph and Telephone Corporation, Tokyo (JP)

(72) Inventor: Kotaro Takeda, Musashino (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 181 days.

(21) Appl. No.: 17/422,005

(22) PCT Filed: Jan. 14, 2020

(86) PCT No.: PCT/JP2020/000918
§ 371 (c)(1),
(2) Date: Jul. 9, 2021

(87) PCT Pub. No.: WO2020/149267
PCT Pub. Date: Jul. 23, 2020

(65) Prior Publication Data
US 2022/0102574 A1 Mar. 31, 2022

(30) Foreign Application Priority Data
Jan. 16, 2019 (JP) ................................ 2019-005272

(51) Int. Cl.
*H01L 31/105* (2006.01)
*H01L 31/0224* (2006.01)
(Continued)

(52) U.S. Cl.
CPC ........ *H01L 31/1055* (2013.01); *H01L 31/024* (2013.01); *H01L 31/028* (2013.01); *H01L 31/022408* (2013.01)

(58) Field of Classification Search
CPC ......... H01L 31/1055; H01L 31/022408; H01L 31/024; H01L 31/028; H01L 31/105; H01L 31/02327
See application file for complete search history.

(56) References Cited

U.S. PATENT DOCUMENTS 3,786,557 A * 1/1974 Bodway ............... H01C 17/265
257/532
5,182,225 A * 1/1993 Matthews ......... H01L 29/41775
257/E21.507
(Continued)

FOREIGN PATENT DOCUMENTS

JP 2000-221455 A 8/2000
JP 2006-245344 A 9/2006
(Continued)

OTHER PUBLICATIONS

G. G. Macfarlane et al., *Fine Structure in the Absorption-Edge Spectrum of Ge*, Physical Review, vol. 108, No. 6, 1957, pp. 1377-1383.

Primary Examiner — Sitaramarao S Yechuri
(74) Attorney, Agent, or Firm — Workman Nydegger

(57) ABSTRACT

The present invention is to provide a GePD, the optical sensitivity of which is independent from a temperature, and to achieve a photodetector in which heat applied from heaters is constant even when a plurality of GePDs are provided and in which a temperature and sensitivity of each of the GePDs are the same. The photodetector includes germanium photoreceivers including a silicon substrate, a lower clad layer, a silicon core layer, a silicon waveguide layer, a germanium layer, an upper clad layer, and electrodes. In the photodetector, two or more germanium photoreceivers are arranged adjacent to each other on the silicon substrate, and the photodetector includes resistors embedded in the upper clad layer to cover or surround respective (Continued)

germanium layers of the two or more germanium photoreceivers arranged adjacent to each other, the resistors being made of a metal or a metal compound.

11 Claims, 22 Drawing Sheets

(51) Int. Cl.
*H01L 31/024* (2014.01)
*H01L 31/028* (2006.01)

(56) References Cited

U.S. PATENT DOCUMENTS

| | | | |
|---|---|---|---|
| 5,285,514 A * | 2/1994 | Nojiri | G02B 6/4206 257/466 |
| 7,010,208 B1 * | 3/2006 | Gunn, III | G02B 6/12004 385/129 |
| 7,453,132 B1 * | 11/2008 | Gunn, III | H01L 31/0232 257/448 |
| 2006/0198416 A1 | 9/2006 | Yamazaki | |
| 2018/0233618 A1 | 8/2018 | Fukuda et al. | |

FOREIGN PATENT DOCUMENTS

| | | |
|---|---|---|
| JP | 2018-74104 A | 5/2018 |
| WO | 2017/038072 A1 | 3/2017 |

* cited by examiner

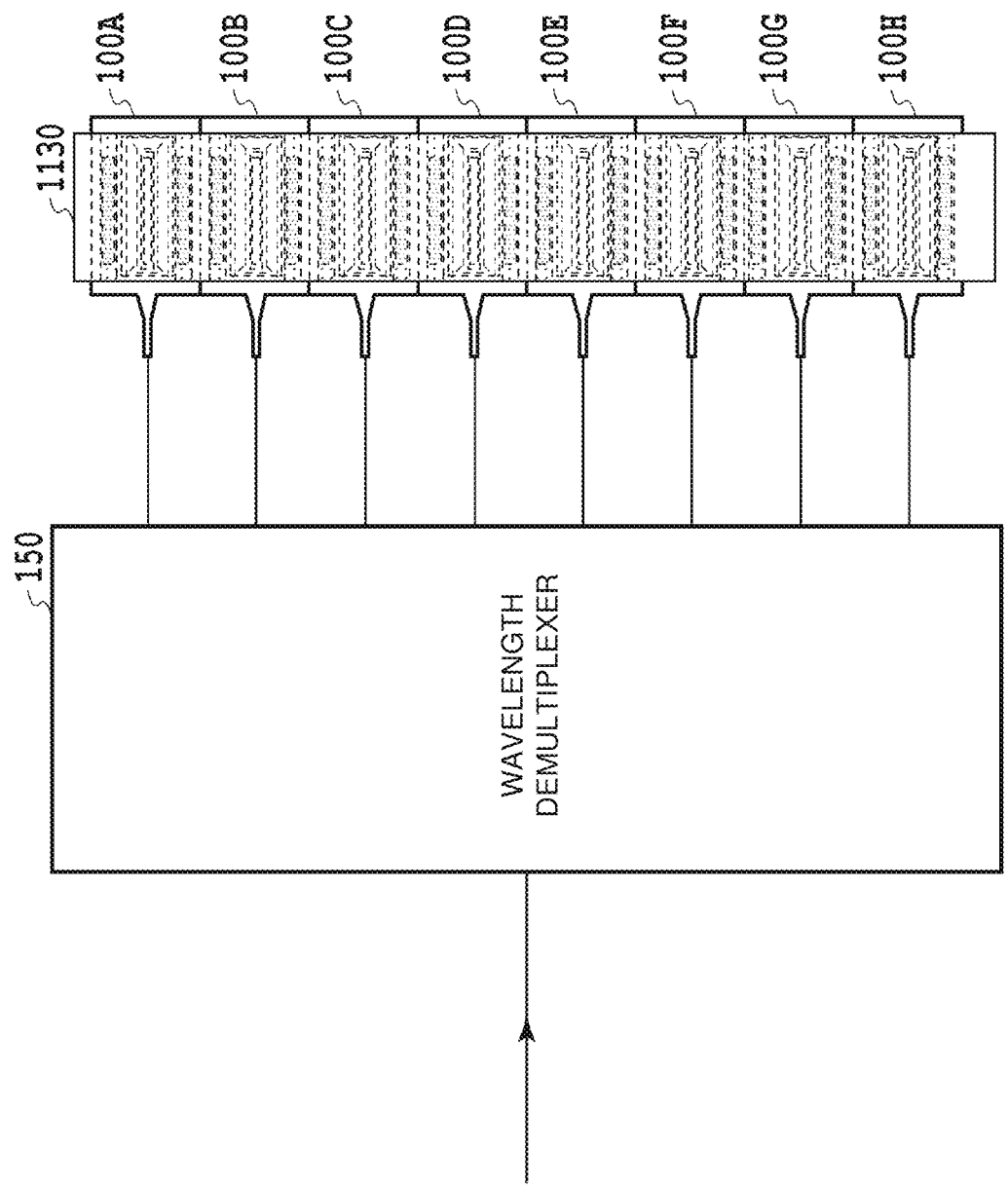

PHOTODETECTOR

TECHNICAL FIELD

The present invention relates to a photodetector used in an optical communication system or an optical information processing system, and more particularly to a structure for providing a photodetector, the optical sensitivity of which is less dependent on temperature.

BACKGROUND ART

With a spread of optical communication in recent years, a reduction in cost of optical communication devices has been required. As one of the solutions, there is a method of forming a large number of optical circuits constituting an optical communication device on a large-diameter wafer, such as a silicon wafer, at a time by using a micro optical circuit technique such as silicon photonics. Thus, the material cost per chip can be dramatically reduced to achieve a reduction in cost of the optical communication device.

An example of a typical photodetector formed on a silicon (Si) substrate using such a technique include a germanium photodetector (GePD) capable of monolithic integration. FIG. 1 is a view schematically showing a structure of a conventional waveguide-coupled vertical GePD 100. FIG. 2 is a cross-sectional view of a substrate taken along a line II-II in FIG. 1. In the GePD 100 shown in FIG. 1, when light input from a waveguide layer 1101 at a left end reaches a Ge layer 114, which is a light absorption layer on a silicon slab 1102 and the light is absorbed, a photoelectric current flows between an electrode 117 and an electrode 116 and 118, and the light is detected.

In FIG. 1 to make the structure easy to understand, a clad layer 103 and a core layer 110 shown in the cross-sectional view of FIG. 2 are not shown, only positions where the electrodes 116 to 118 are in contact with silicon electrode portions 112 and 113 formed by ion implantation with a first impurity (for example, a p-type) and are in contact with a Ge region 115 formed by ion implantation with a second impurity (for example, an n-type) having a conductivity type opposite to the first impurity are displayed. The GePD 100 is formed on an Si substrate and an SOI (Silicon On Insulator) substrate including an Si oxide film and a surface Si layer, using a lithography technique.

In the cross-sectional view of the substrate of FIG. 2, the GePD 100 includes an Si substrate 101, a lower clad layer 102 formed on the Si substrate and made of an Si oxide film, a core layer 110 for guiding signal light, a Ge layer 114 formed on the core layer 110 to absorb light, and an upper clad layer 103 formed on the core layer 110 and the Ge layer 114.

The core layer 110 in FIG. 2 corresponds to the waveguide layer 1101 and the silicon slab 1102 in FIG. 1.

On the core layer 110 in FIG. 2, an Si slab 111 formed by ion implantation with the first impurity and silicon electrode portions 112 and 113 doped with the first impurity at a high concentration and act as electrodes are formed. On the Si slab 111 between the two electrode portions 112 and 113, the Ge layer 114 is stacked by epitaxial growth, on which the Ge region 115 doped with the second impurity is formed. The Ge layer 114 can also be a light absorption layer of a germanium compound, and is collectively referred to as a germanium layer. Then, the electrodes 116 to 118 are provided on the silicon electrode portions 112 and 113 and the Ge region 115 to be in contact therewith, and a photoelectric current is detected.

When light is incident on the silicon slab 1102 from the waveguide layer 1101 and the light is absorbed by the Ge layer 114, a photoelectric current flows between the electrode 117 and the electrodes 116 and 118, and thus the GePD detects the current to detect the light.

Horizontal GePDs as shown in FIGS. 3 and 4 also exist conventionally. A horizontal GePD 100 shown in FIG. 3 includes a germanium region 121 formed by ion implantation with a first impurity and a germanium region 122 formed by ion implantation with a second impurity, instead of the p-type Si slab 111 formed by ion implantation with the first impurity and the Ge region 115 doped with the second impurity as shown in FIG. 2. The germanium regions 121 and 122 are separated from each other by a Ge layer 114, and photoelectric currents are detected from electrodes 116 and 118.

Another horizontal GePD 100 shown in FIG. 4 includes a silicon region 124p formed by ion implantation with a first impurity, a silicon region 124n formed by ion implantation with a second impurity, and a silicon electrode portion 125 doped with the second impurity at a high concentration and acts as an electrode, instead of the p-type Si slab 111 formed by ion implantation with the first impurity and the Ge region 115 doped with the second impurity as shown in FIG. 2. In a region 123 between the silicon region 124p and the silicon region 124n, a Ge layer 114 straddles the two silicon regions and is in contact with a core layer 110, and photoelectric currents are detected from electrodes 116 and 118. In both of the horizontal GePDs, the Ge layer 114 can be a light absorption layer formed of a germanium compound layer, and is collectively referred to as a germanium layer.

CITATION LIST

Patent Literature

Patent Literature 1: Japanese Patent Laid-Open No. 2000-221455
Patent Literature 2: Japanese Patent Laid-Open No. 2006-245344
Patent Literature 3: Japanese Patent Laid-Open No. 2018-74104

Non-Patent Literature

Non-Patent Literature 1: G. G. Macfarlane, T. P. McLean, J. E. Quarrington and V. Roberts, "Fine Structure in the Absorption-Edge Spectrum of Ge", Phys. Rev. 108, 6 (1957) 1377-1383.

SUMMARY OF THE INVENTION

Technical Problem

However, the conventional GePDs 100 shown in FIGS. 1 to 4 have a problem that a temperature characteristic of optical sensitivity (characteristic of current output with respect to optical input power, unit: A/W) is not constant.

FIG. 5 is a graph obtained by plotting sensitivity of photoelectric conversion with respect to three different temperatures when a reverse bias of 1.6 V is applied in GePD communication wavelength bands C-band and L-band (wavelengths 1530 to 1565 nm and 1565 to 1625 nm). For example, the sensitivity is almost constant up to the vicinity of the C-band at 31° C., but the sensitivity decreases in the L-band. Such a change in sensitivity is caused by a change in a light absorption spectrum of germanium. The sensitivity tends to decrease at −5° C. even in the C-band.

FIG. 6 shows a temperature dependence of the light absorption spectrum of germanium itself (see Non-patent Literature 1). When the temperature becomes low, a band gap of germanium shifts to a high energy side. In other words, a light absorption spectrum edge shifts to a short wavelength side. The light absorption spectrum edge of germanium used in the GePD is exactly in the vicinity of 1565 nm on a long wavelength side of the C-band at 31° C. Therefore, even in GePD showing constant sensitivity over the entire C-band at 31° C., the sensitivity gradually decreases from the long wavelength side as the temperature lowers. FIG. 5 shows such a tendency, and the sensitivity tends to decrease at −5° C. at which the temperature lowers as the wavelength becomes longer.

When the GePD, in which the sensitivity changes depending on the temperature and the wavelength, is incorporated into an optical communication system, since a circuit for compensating for the change in sensitivity is required, the manufacturing cost increases.

An example of a means for solving the temperature dependence includes a means for providing a heater to stabilize the temperature around the device (see Patent Literatures 1 and 2). However, according to such a means, since the heater itself has a size, the area of the device itself increases. In order to solve such a problem, there is a method of using, as a heater, a resistor 130 made of a metal or a metal compound and is placed in an overclad directly above a GePD as shown in FIG. 7, or of using, as a heater, a resistor 131 formed as a linear conductive region by ion implantation into a core layer 110 of a GePD as shown in FIG. 8 (see Patent Literature 3). When such a method is used, the area of the GePD will not be increased.

However, in an optical communication system or an optical information processing system using a GePD, a single GePD is rarely used, and about 2 to 8 GePDs are generally used side by side. In a system that employs wavelength division multiplexing (WDM) using multiple wavelengths, GePDs may in some cases be required as many as the number of wavelengths, and in a system that employs an optical digital coherent communication technology, a plurality of PDs may be required as balance PDs.

FIG. 9 shows an example of a configuration of a conventional optical receiver used in the optical digital coherent communication technology. In such a configuration, received polarization-multiplexed light input to a polarization divider 901 is polarized and divided, and is combined with a local beam of two different polarizations from a local beam-emitting source 900 in two optical hybrids 940 and 941. Eight GePDs 950A to 950H are used for photoelectric conversion of eight beams, that is, a total of four beams output from each of the two optical hybrids 940 and 941.

In the conventional configuration, eight heaters are required when the GePDs individually provided with heaters are used. In particular, uniform optical sensitivity is required groups of GePDs 950A to 950D and 950E to 950H connected to the same optical hybrid. When the sensitivity is not uniform, a common-mode rejection ratio deteriorates and the performance of the receiver deteriorates. For this reason, the GePDs need to have the same sensitivity, and each of the GePDs need to be kept at a constant temperature. However, since eight heaters have manufacturing variations, when two or more GePDs 100A, 100B, 100C, . . . are driven by individual heaters 130A, 130B, 130C, . . . as in a main circuit configuration of a conventional photodetector shown in FIG. 10, there are problems that the amount of heat given to each of the GePDs is not constant, the temperature of each of the GePDs varies, and, as a result, the optical sensitivity varies.

An object of the present invention, which has been made in view of such problems, is to provide a GePD, the optical sensitivity of which is independent from the temperature in the C-band and the L-band, using an integrated heater or a group of commonalized heaters for each GePD and to achieve a photodetector in which heat applied from heaters is constant even when a plurality of GePDs are provided and in which a temperature and sensitivity of each of the GePDs are the same.

Means for Solving the Problem

The present invention is characterized by the following configurations in order to achieve such an object.

Configuration 1

A photodetector comprising germanium photoreceivers including: a silicon substrate; a lower clad layer formed on the silicon substrate; a silicon core layer formed on the lower clad layer and including a silicon region doped with a first conductivity-type impurity; a silicon waveguide layer connected to the silicon core layer; a germanium layer formed on the silicon core layer and including a germanium region doped with a second conductivity-type impurity; an upper clad layer formed on the silicon core layer and the germanium layer; and electrodes connected to the silicon region and the germanium region, respectively, wherein two or more germanium photoreceivers are arranged adjacent to each other on the silicon substrate, and the photodetector includes resistors embedded in the upper clad layer to cover respective germanium layers of the two or more germanium photoreceivers arranged adjacent to each other, the resistors being made of a metal or a metal compound.

Configuration 2

A photodetector comprising germanium photoreceivers including: a silicon substrate; a lower clad layer formed on the silicon substrate; a silicon core layer formed on the lower clad layer and including a silicon region doped with a first conductivity-type impurity; a silicon waveguide layer connected to the silicon core layer; a germanium layer formed on the silicon core layer and including a germanium region doped with a second conductivity-type impurity; an upper clad layer formed on the silicon core layer and the germanium layer; and electrodes connected to the silicon region and the germanium region, respectively, wherein two or more germanium photoreceivers are arranged adjacent to each other on the silicon substrate, and the photodetector includes resistors formed by doping an impurity into the silicon core layer to cover respective germanium layers of the two or more germanium photoreceivers arranged adjacent to each other.

Configuration 3

The photodetector according to Configuration 1 or 2, wherein the resistors are integrally formed to cover or surround the germanium layers of all of the germanium photoreceivers.

Configuration 4

The photodetector according to Configuration 1 or 2, wherein, the resistors are provided as many as the number of germanium photoreceivers, the resistors are arranged on a straight line, the resistors are connected to each other by a metal electrode, and the respective resistors share a power source.

Configuration 5

The photodetector according to Configuration 3 or 4, wherein an input optical waveguide of each of the germanium photoreceivers includes a bent portion, and optical axes of the germanium photoreceivers are arranged to be placed on a straight line.

Configuration 6

The photodetector according to Configuration 5, wherein the two germanium photoreceivers are arranged back to back to detect paired optical outputs such that the bent portions of the input optical waveguides are provided on opposite sides and adjacent to each other.

Effects of the Invention

As described above, in the photodetector according to the present invention, since the GePD receives heat from an integrated resistor or a group of resistors that function as heaters, the temperature does not become low. As can be seen from FIG. 5, the GePD can have substantially constant sensitivity over the entire wavelength band of the L-band unless the temperature is below 85° C., and over the entire wavelength band of the C-band unless the temperature is below 31° C.

In addition, the respective resistors share a power source, are manufactured by the same process, and are integrally configured or arranged adjacent to each other in a line as a group, the variation in resistance is prevented, and the heat applied to the GePD becomes hardly non-uniform. In other words, since the variation in the amount of heat applied to each of the resistors can be prevented compared with the conventional case where a plurality of GePDs including individual heaters are arranged, heat is uniformly applied all of the GePDs. Since the resistors having a uniform amount of heat applied to the respective GePDs are provided, it is possible to provide an optical communication system in which the optical sensitivity does not vary for each GePD, and a common-mode rejection ration does not deteriorate.

BRIEF DESCRIPTION OF DRAWINGS

FIG. 22 is a view showing a configuration of an optical receiver according to Example 10 of the present invention.

DESCRIPTION OF EMBODIMENTS

Forms of photodetectors of the present invention will be described below in detail with reference to preferred examples.

EXAMPLE 1

Figure 1:
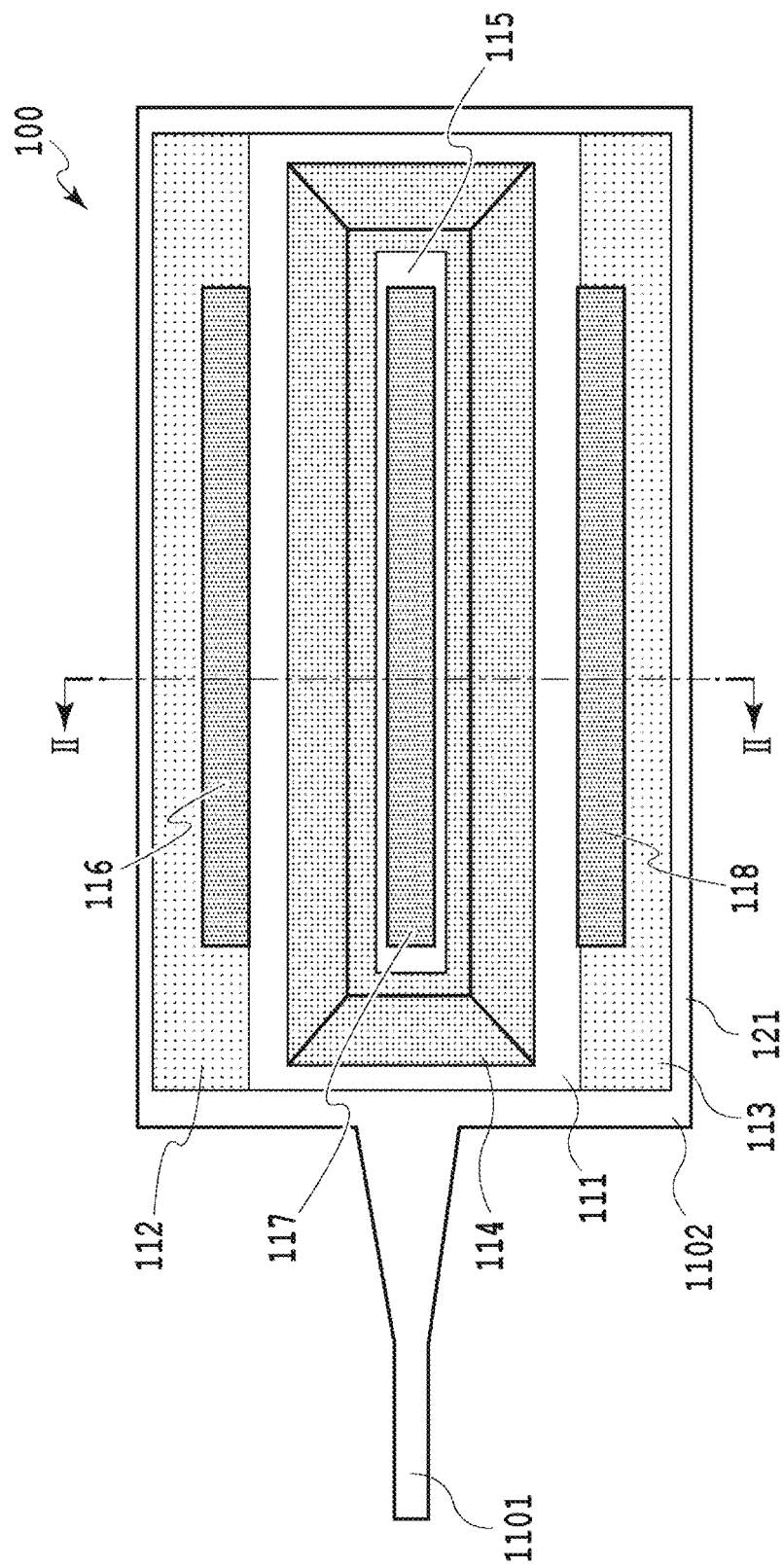
FIG. 1 is a plan view of a substrate of a conventional general vertical GePD.
Figure 2:
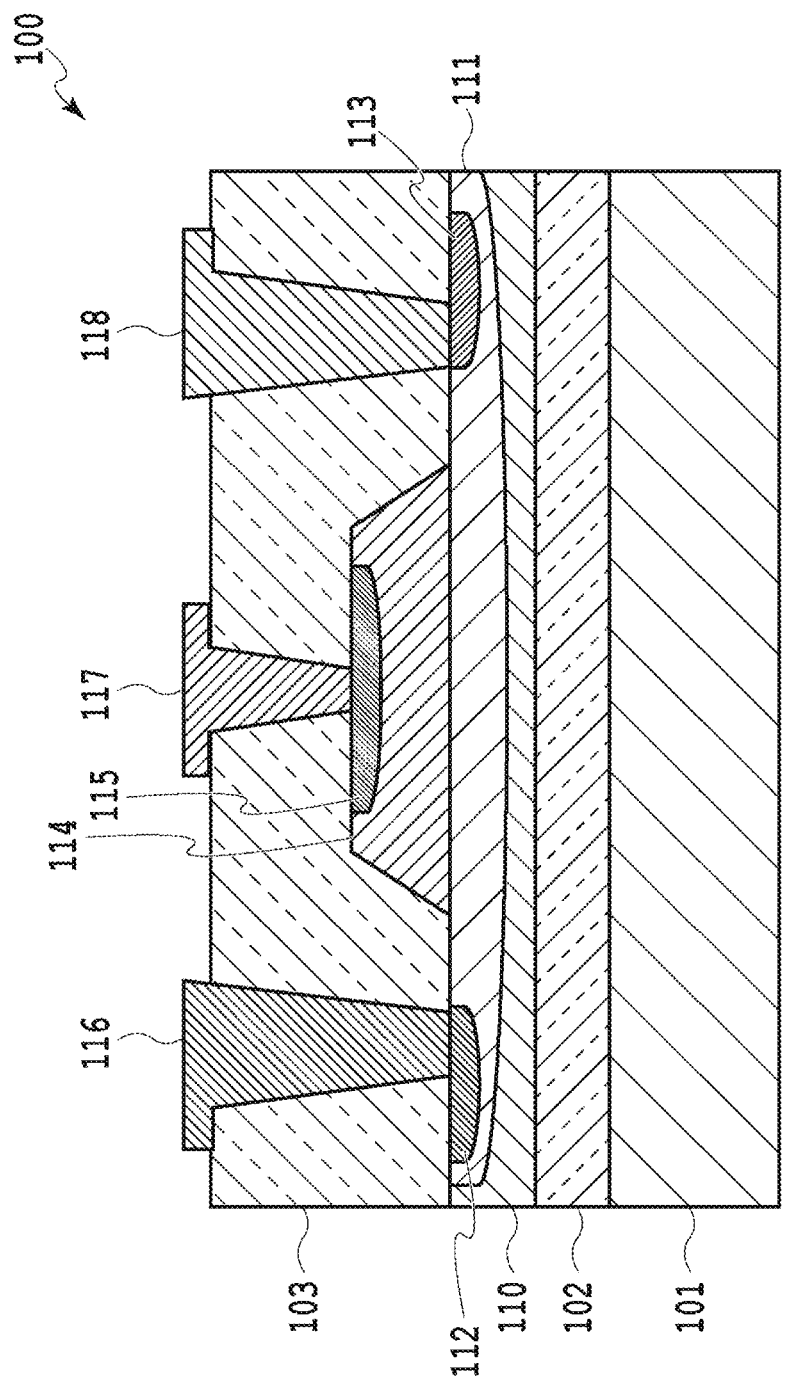
FIG. 2 is a cross-sectional view of the substrate of the GePD shown in FIG. 1.
Figure 3:
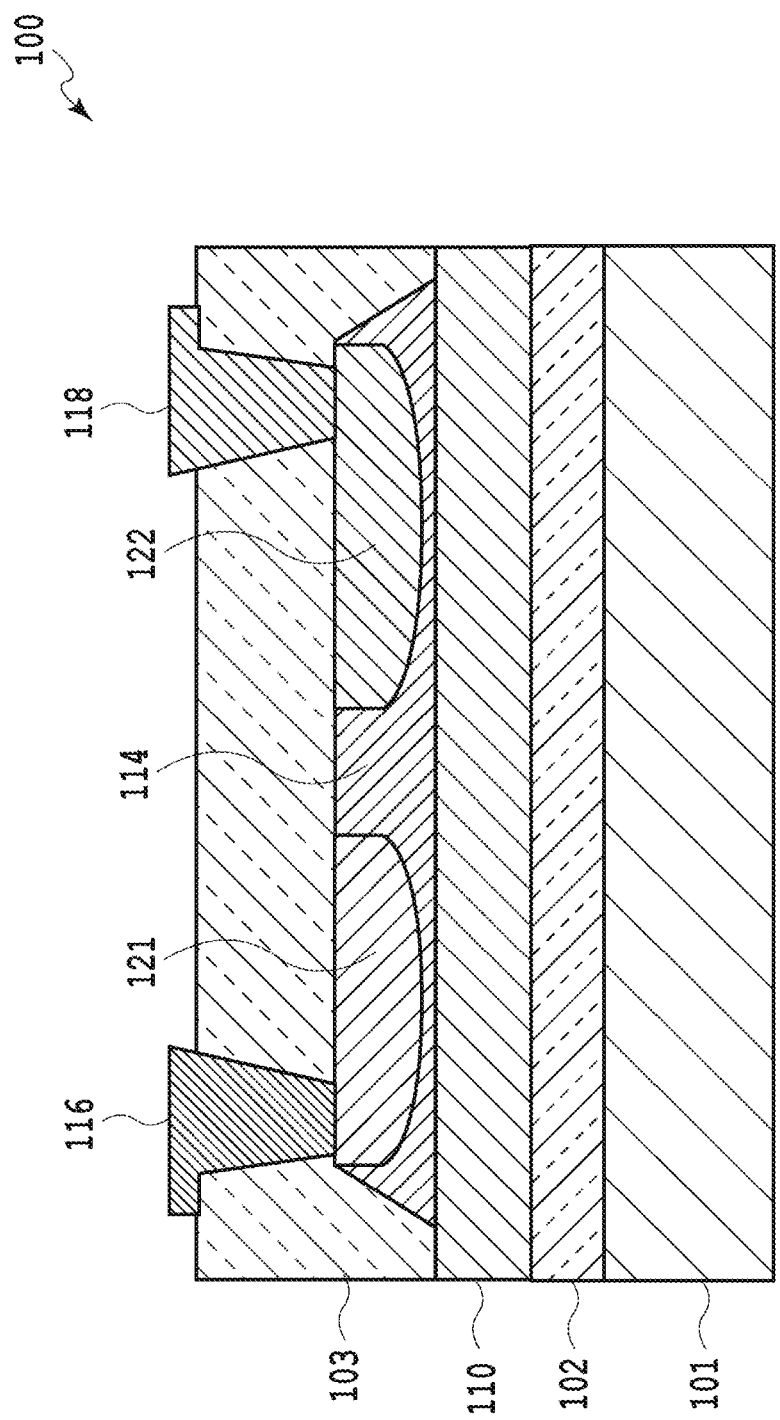
FIG. 3 is a cross-sectional view of a substrate of a conventional general horizontal GePD.
Figure 4:
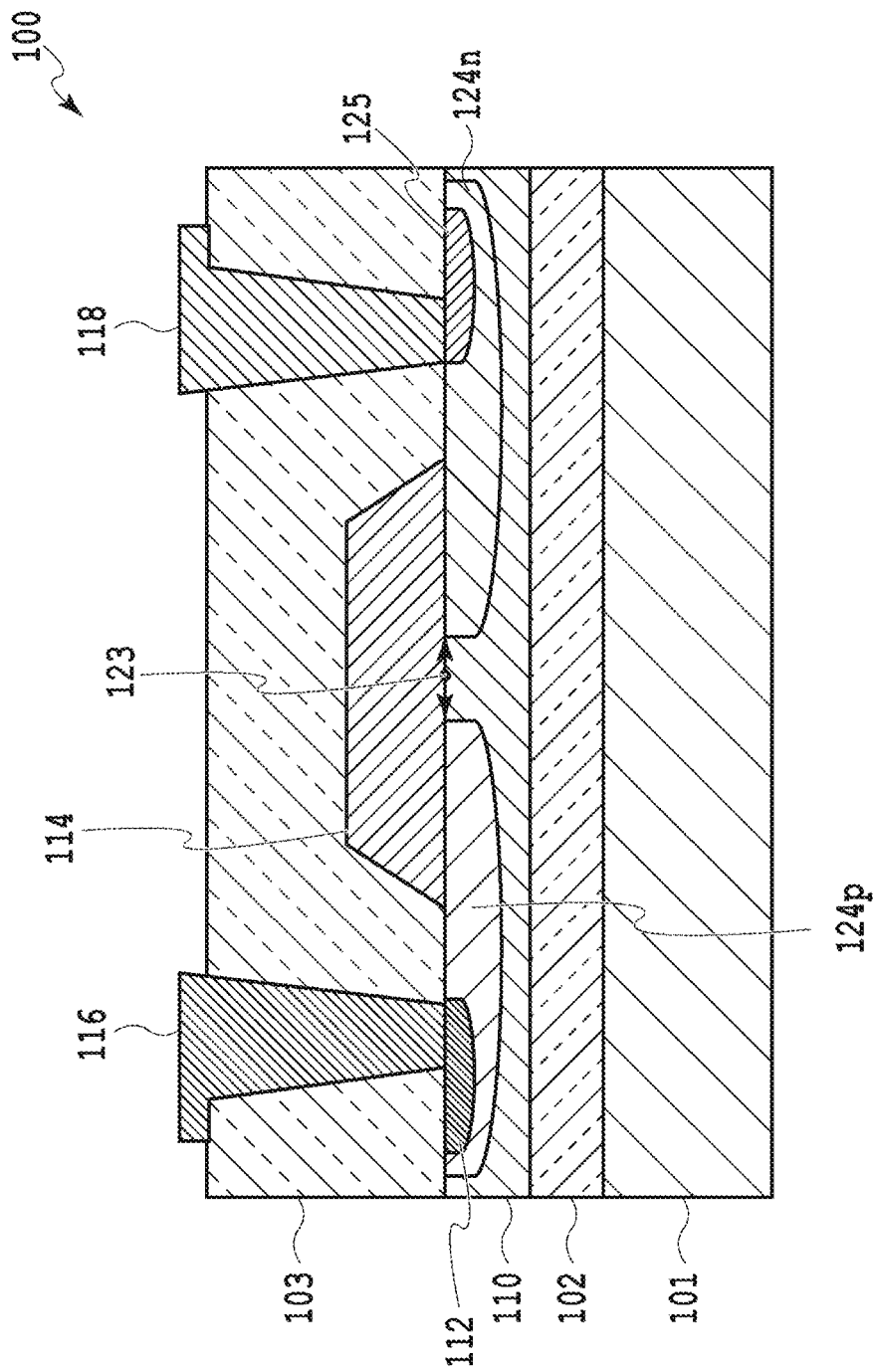
FIG. 4 is a cross-sectional view of a substrate of another example of a conventional general horizontal GePD.
Figure 5:
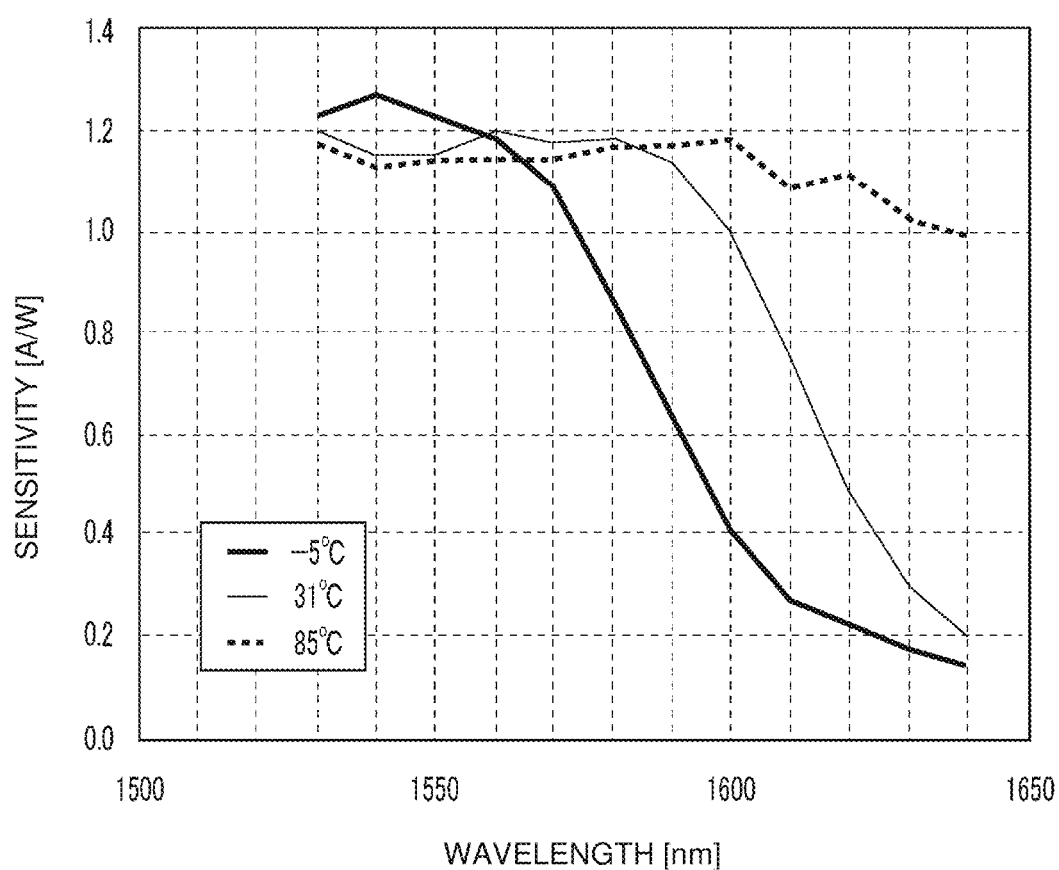
FIG. 5 is a graph showing a wavelength characteristic of photoelectric sensitivity at three temperatures of the conventional GePD.
Figure 6:
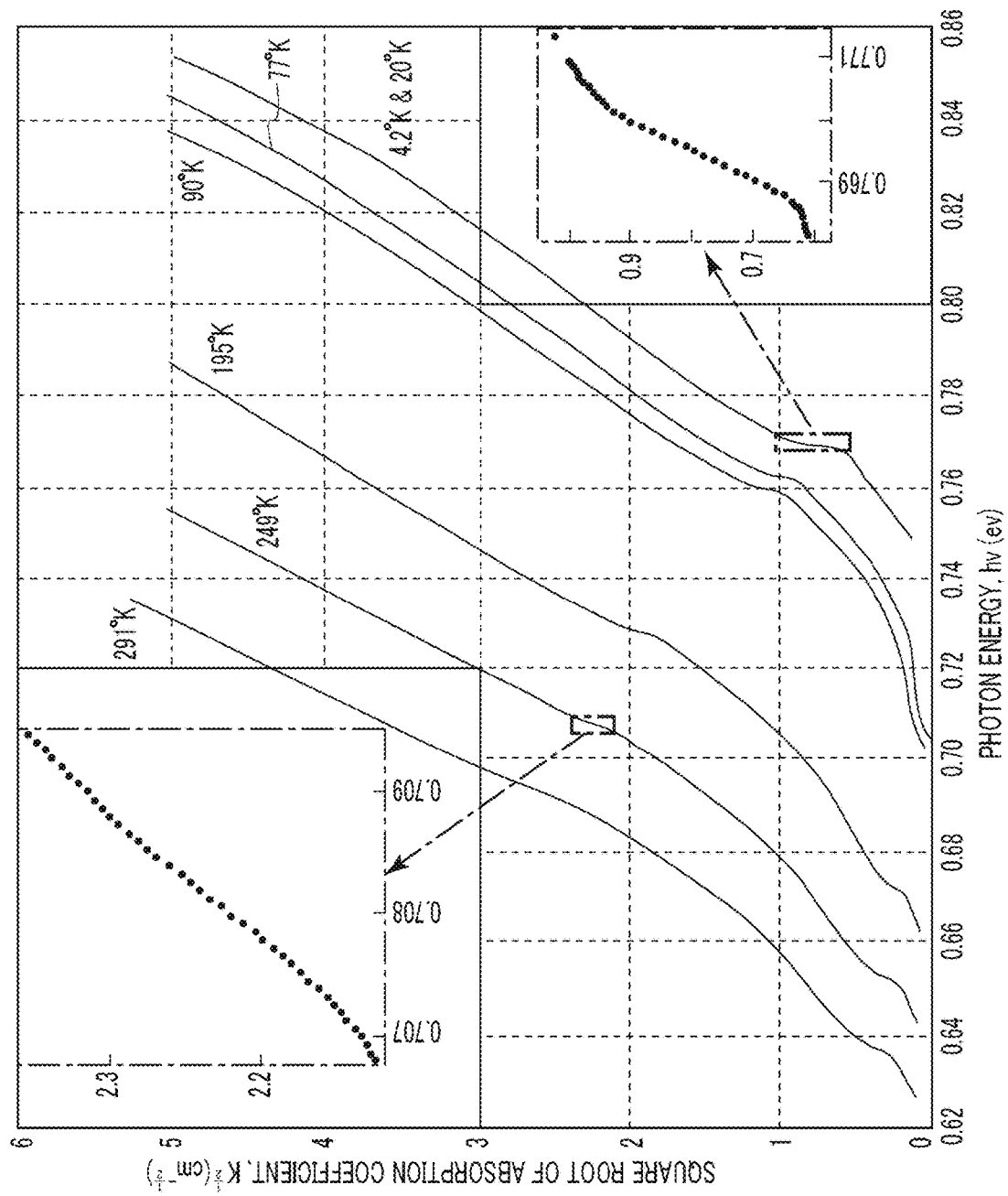
FIG. 6 is a graph showing a temperature dependence of a light absorption spectrum of Ge.
Figure 7:
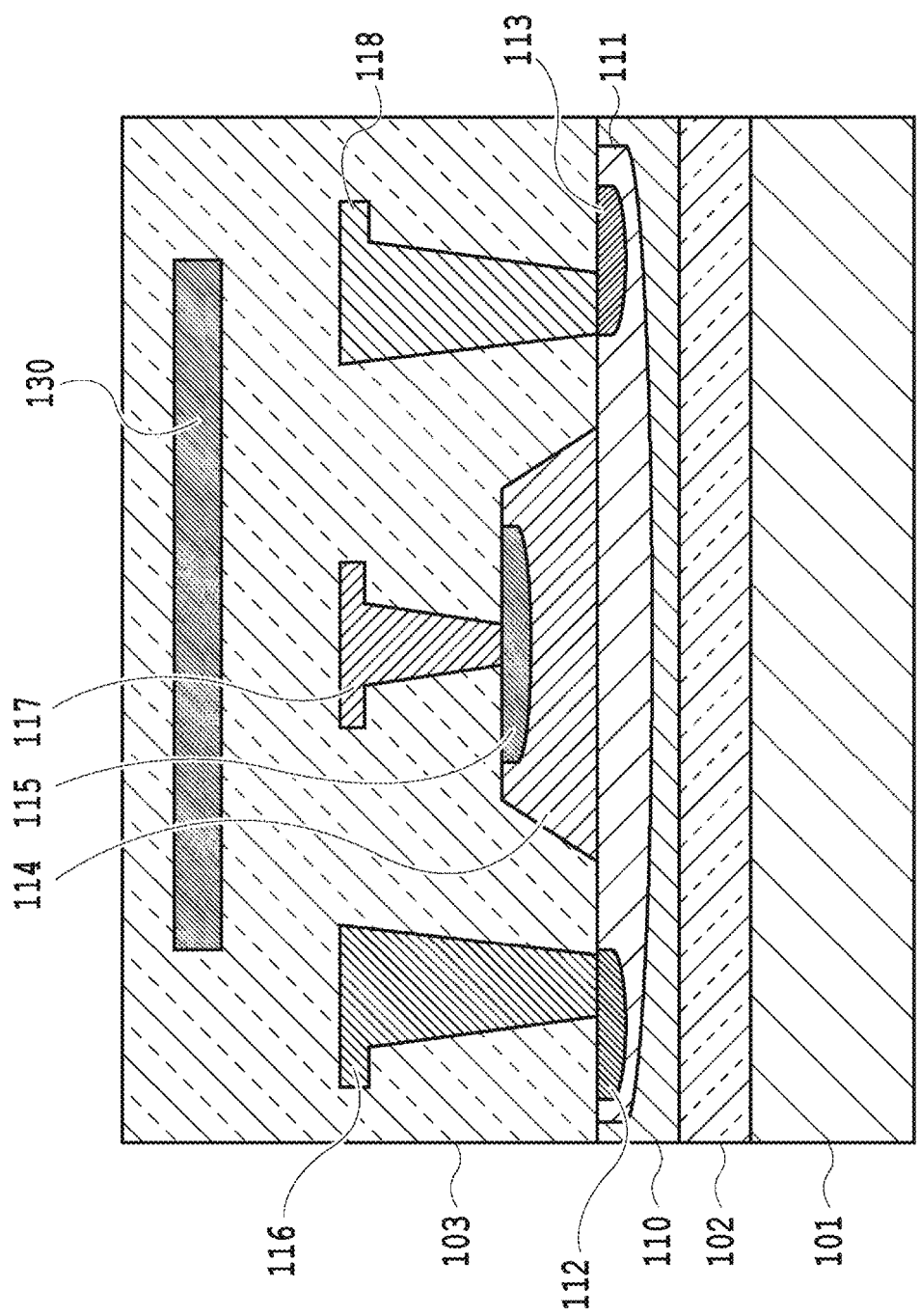
FIG. 7 is a cross-sectional view of a substrate of a conventional photoreceiver.
Figure 8:
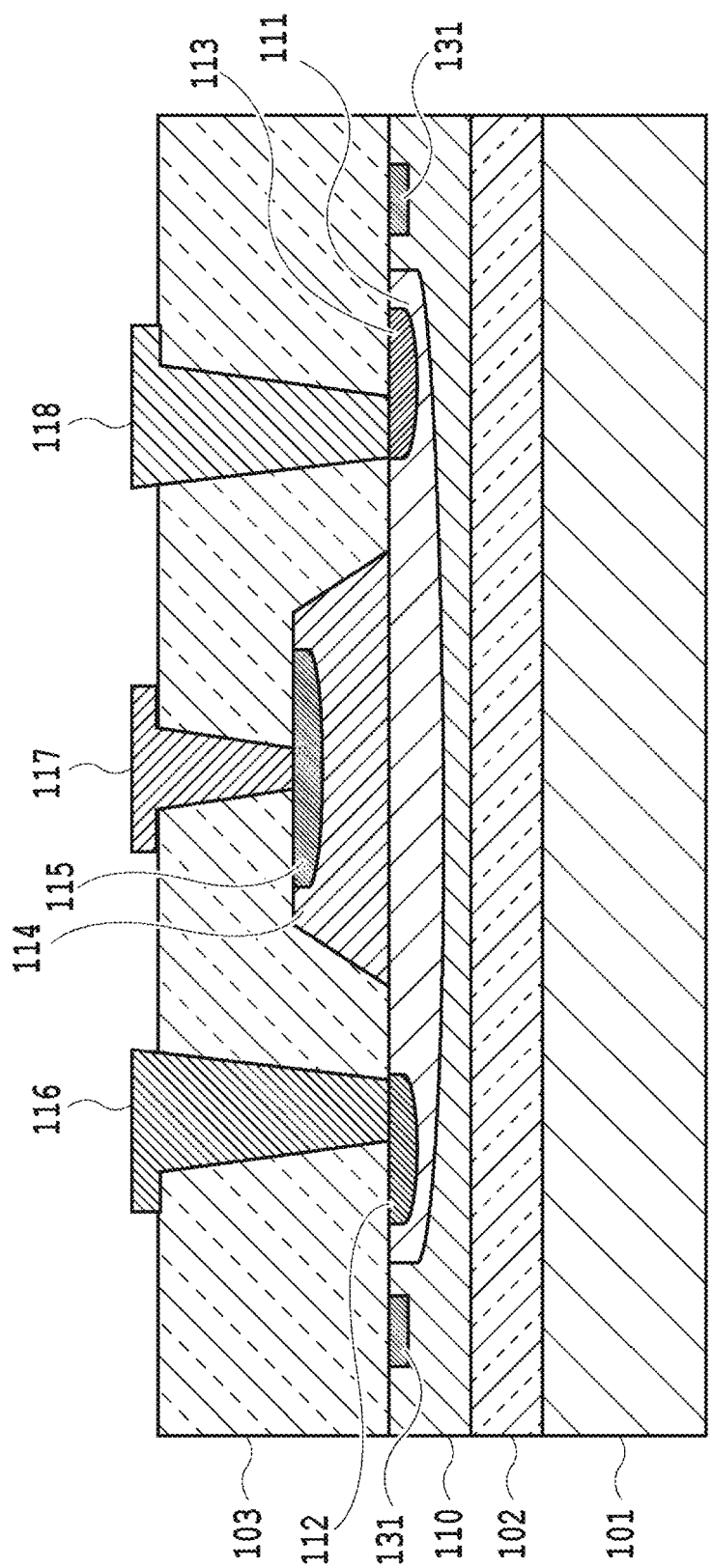
FIG. 8 is a cross-sectional view of a substrate of another example of a conventional photoreceiver.
Figure 9:
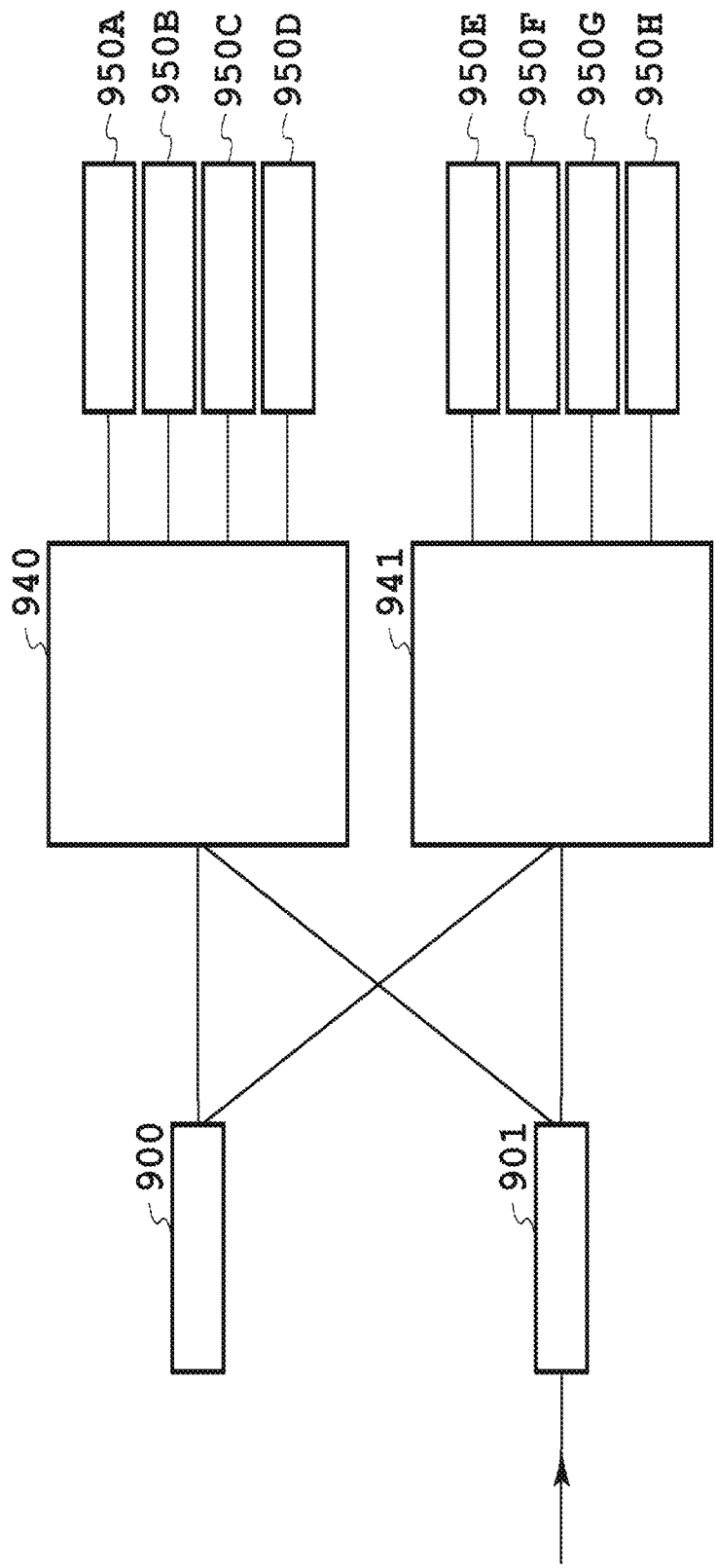
FIG. 9 is a view showing an example of a configuration of a conventional optical receiver used in an optical digital coherent communication technology.
Figure 10:
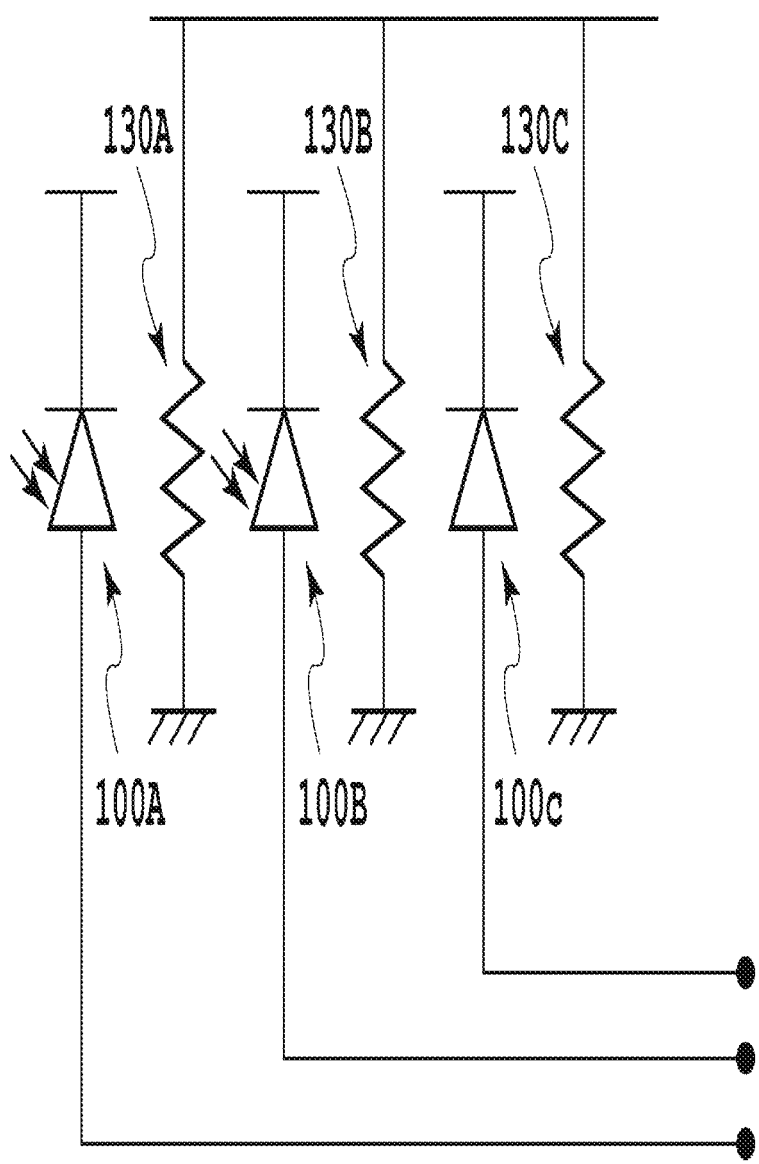
FIG. 10 shows a main circuit configuration of a conventional photodetector.
Figure 11:
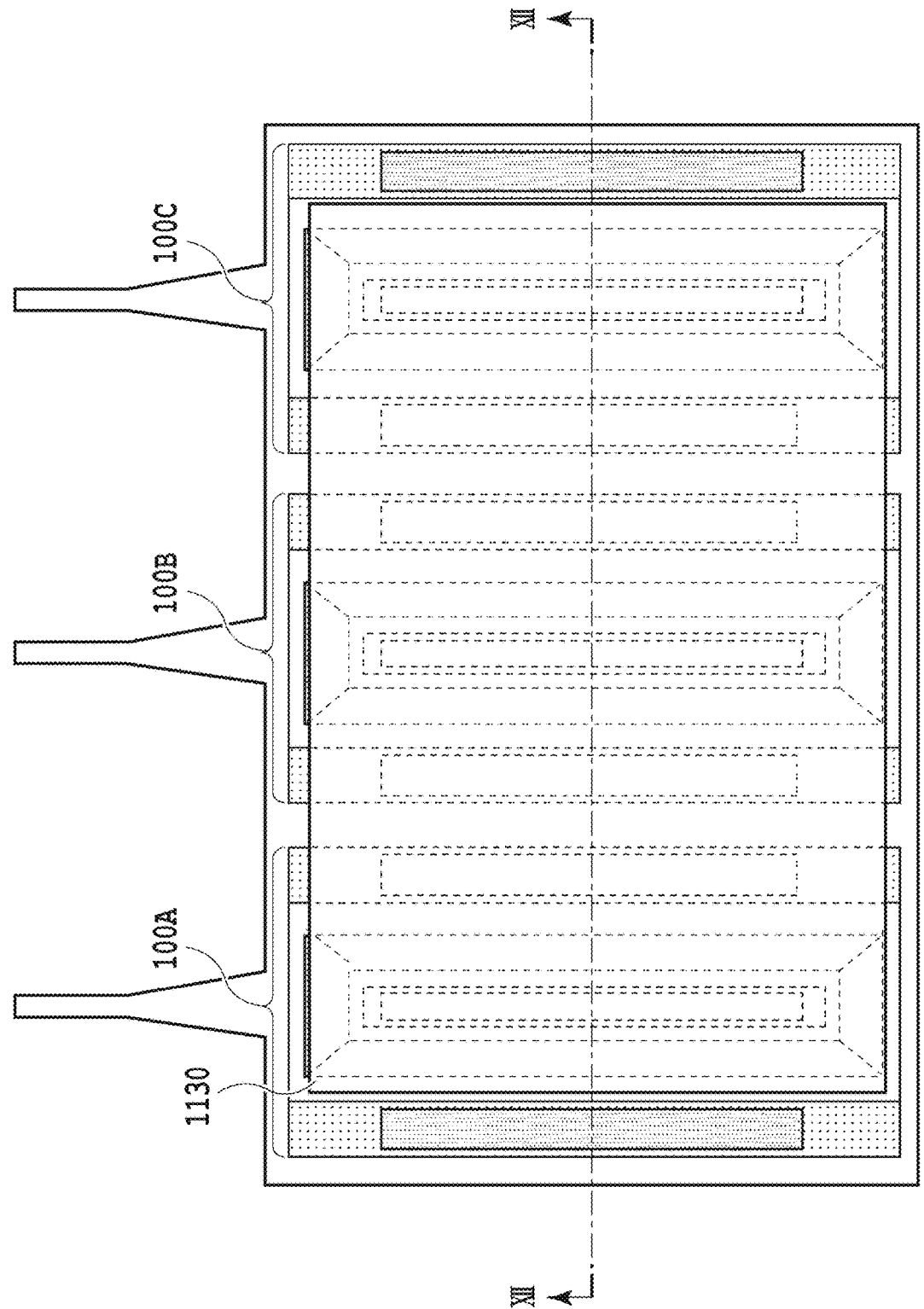
FIG. 11 is a plan view of a substrate of a photodetector according to Example 1 of the present invention.

FIG. 11 is a substrate plan view showing a configuration of a photodetector according to Example 1 of the present invention. Such a configuration is an example in which one integrated heater (resistor) 1130 formed of metal or metal compound is arranged in a common rectangular form in three GePDs 100A to 100C.

The number of GePDs is not limited to three, and some may be arranged in a line. In FIG. 11, the integrated rectangular heater 1130 is arranged such that a longitudinal direction thereof is left and right in an optical input axis direction (a vertical direction in the drawing) of the GePD, and covers germanium layers of all the GePDs 100A to 100C. A power feeding unit of the heater is not shown, but may be configured in such a manner that metal electrodes having low electrical resistance are provided on any two opposite sides of the rectangular resistor to feed power and not to cause bias of a current density inside the resistor.

Figure 12:
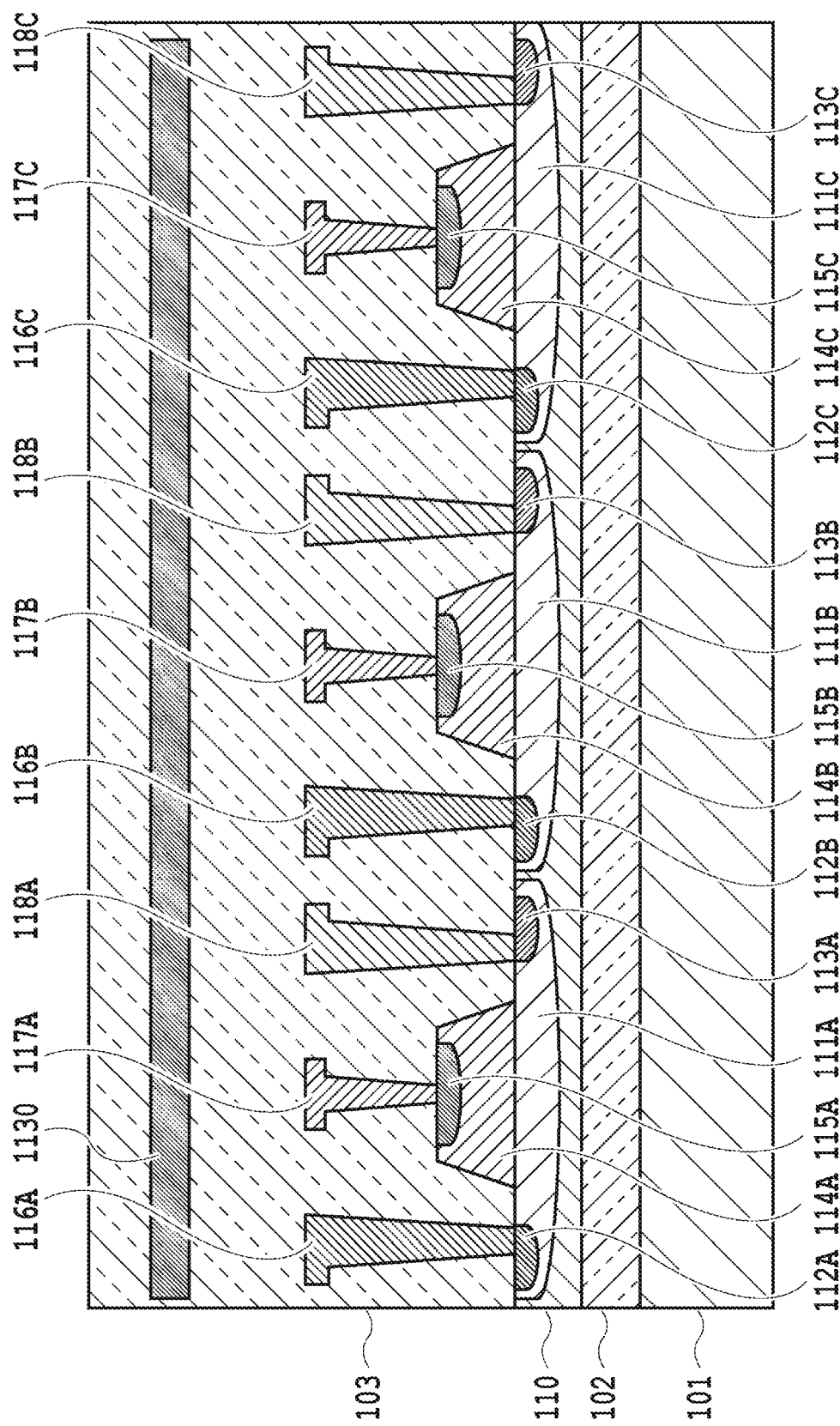
FIG. 12 is a cross-sectional view of the substrate of the photodetector according to Example 1 of the present invention.

FIG. 12 is a cross-sectional view of the substrate perpendicular to an optical axis in a line XII-XII in FIG. 11 according to Example 1. The heater 1130 is arranged in the upper portion of a common clad layer 103 to cover all of germanium layers 114A to 114C of the three GePDs 100A to 100C. The GePDs 100A to 100C are arranged adjacent to each other on a silicon substrate 101 such that heat of the heater 1130 is efficiently applied to the germanium layers 114A to 114C. In Example 1, only one heater 1130 is formed in the plurality of GePDs, and no variation in resistance value can essentially occur. By such a configuration, the variation is prevented to the maximum.

EXAMPLE 2

Figure 13:
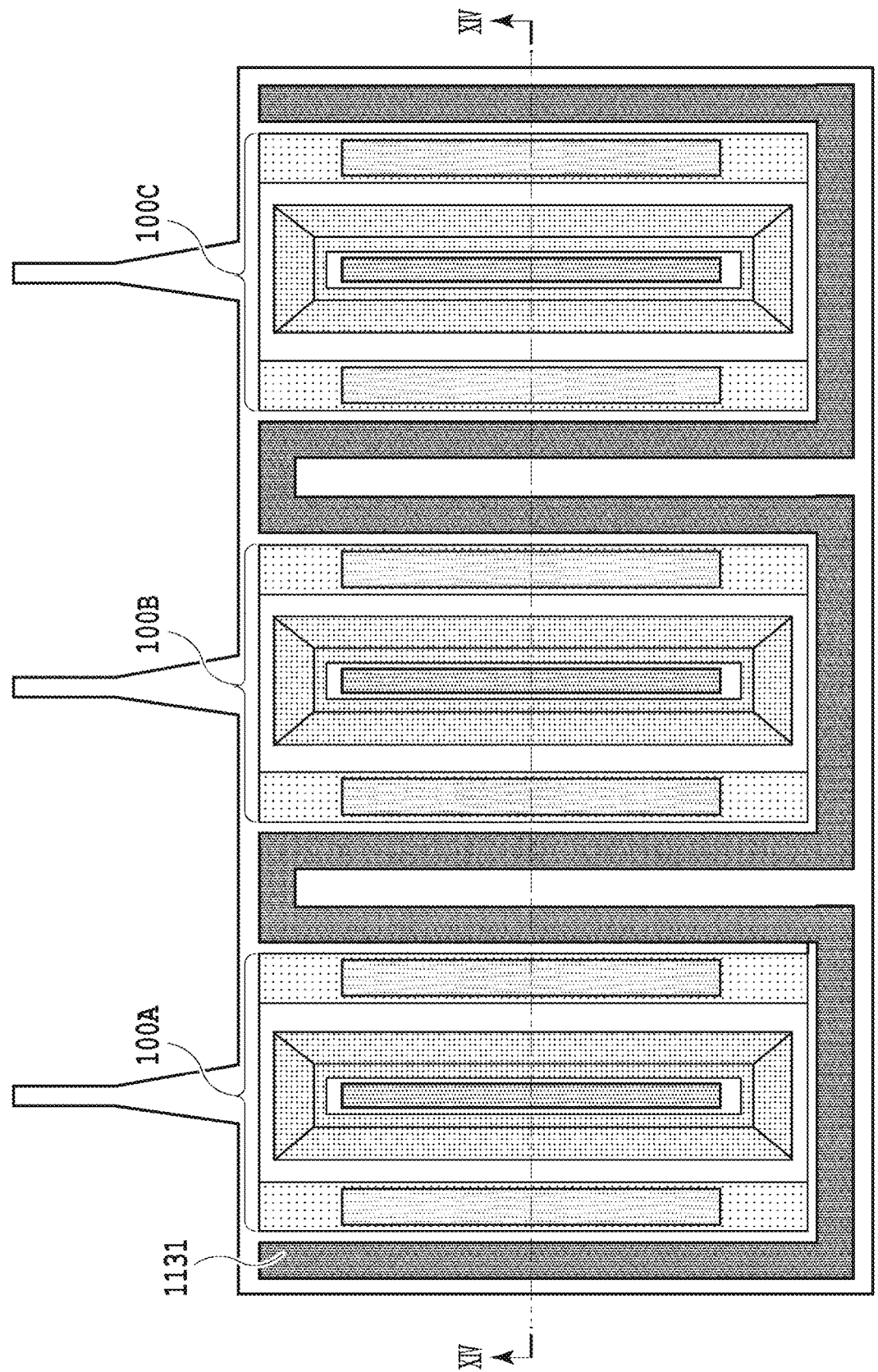
FIG. 13 is a plan view of a substrate of a photodetector according to Example 2 of the present invention.

FIG. 13 is a substrate plan view showing a configuration of a photodetector according to Example 2 of the present invention. Such a configuration is an example in which a linear heater 1131 made by ion implantation into a common core layer 110 of GePD is arranged in three GePDs 100A to 100C to surround germanium layers of the respective GePDs. The heater 1131 is made as one linear resistor, and power is fed between one end (for example, a left upper end) and the other end (for example, a right upper end). The number of GePDs is not limited to three, some may be arranged in a line. As shown in FIG. 13, the heater 1131 is arranged by being bent in a comb-tooth shape to surround three germanium layers 114A to 114C. The heater 1131 may have a meandering shape, for example, a shape formed to cross an input waveguide side of the GePD 100B, but should be considered not to have an influence on input signal light of the GePD 100B.

Figure 14:
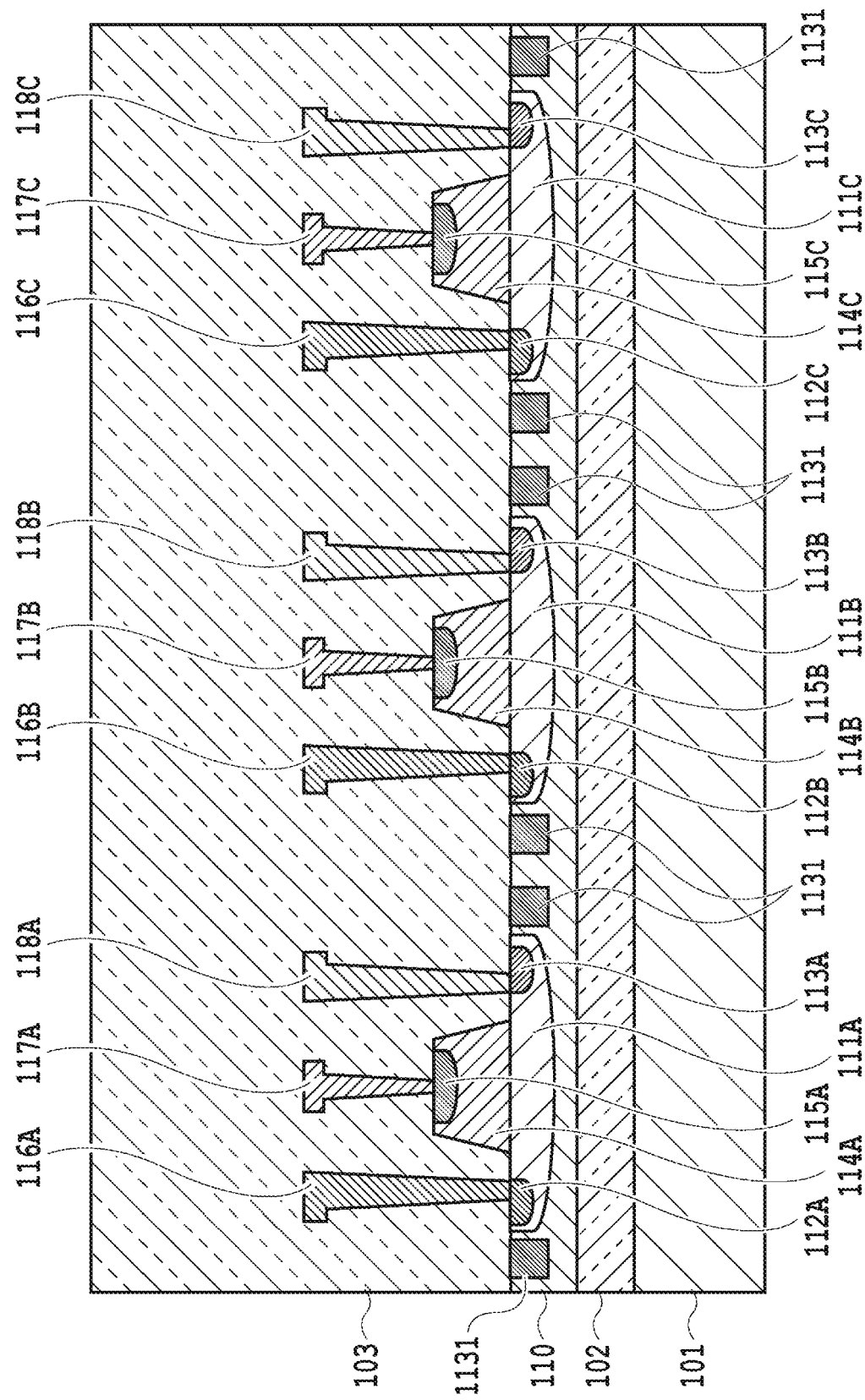
FIG. 14 is a cross-sectional view of the substrate of the photodetector according to Example 2 of the present invention.

FIG. 14 is a cross-sectional view of the substrate perpendicular to an optical axis in a line XIV-XIV in FIG. 13 according to Example 2. The GePDs 100A to 100C are arranged adjacent to each other on a silicon substrate 101 such that heat of the heater 1131 is efficiently applied to the germanium layer 114.

EXAMPLE 3

Figure 15:
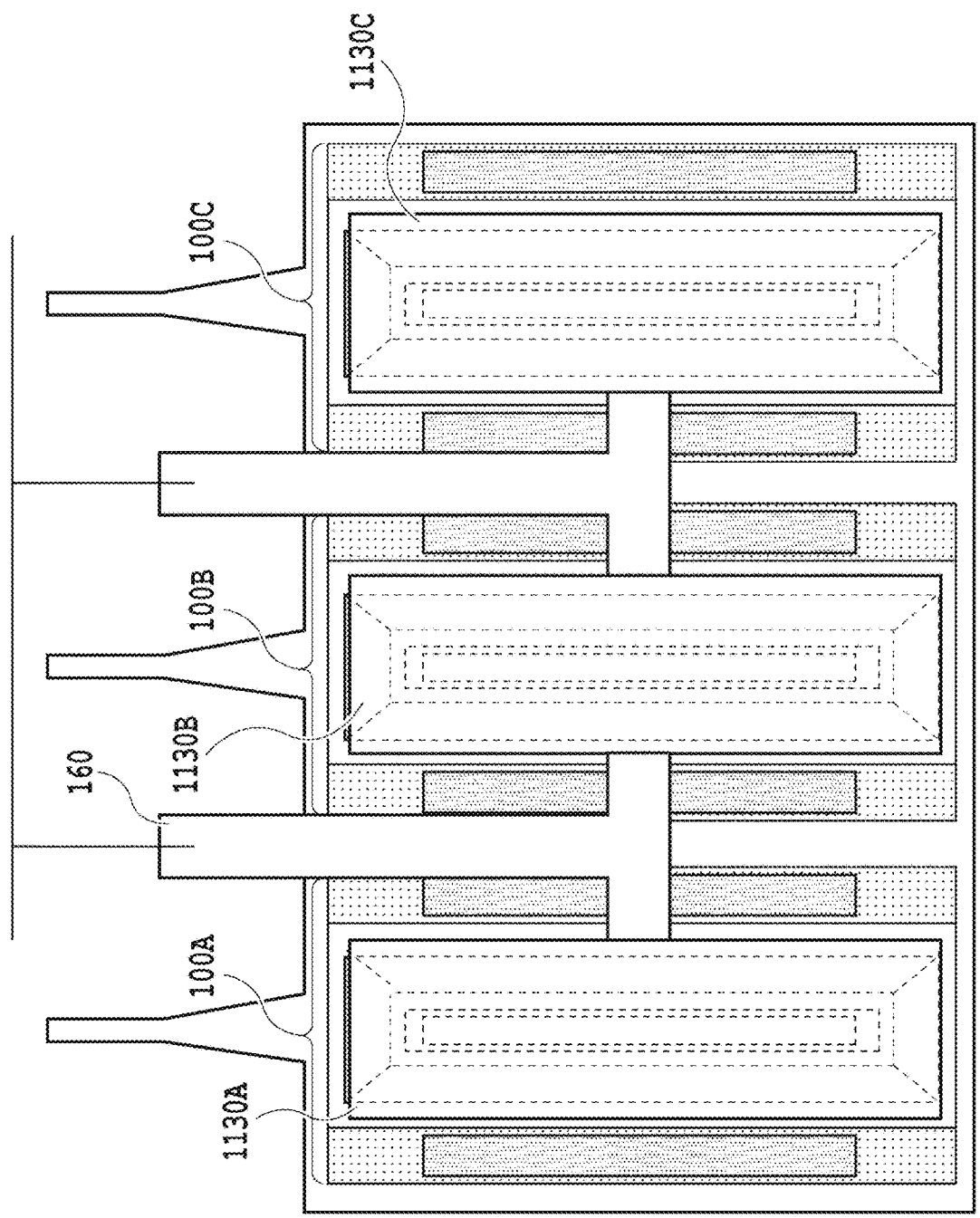
FIG. 15 is a plan view of a substrate of a photodetector according to Example 3 of the present invention.

FIG. 15 is a substrate plan view showing a configuration of a photodetector according to Example 3 of the present invention. Example 3 is an example in which one rectangular heater 1130 of Example 1 (FIG. 11) is divided into three heaters 1130A, 1130B, and 1130C according to the number of GePDs. Since the three heaters are made with the same size by the same process, are arranged adjacent to each other on a straight line, and share a power source, variation in resistance hardly occur. Since the heater are connected to each other by a low resistance metal electrode 160 to feed power, it is possible to efficiently apply heat to germanium layers of the respective GePDs compared with Example 1.

Although a metal electrode on a ground side is not shown, portions of the metal electrodes being in contact with the heaters 1130A, 1130B, and 1130C are desirably provided on two opposite sides of any rectangular heater over the entire length of the sides in order to prevent the concentration or unevenness of the current density inside the heaters, and are provided over the entire length of the sides as a pair of metal electrodes on a power feed side and a ground side.

EXAMPLE 4

Figure 16:
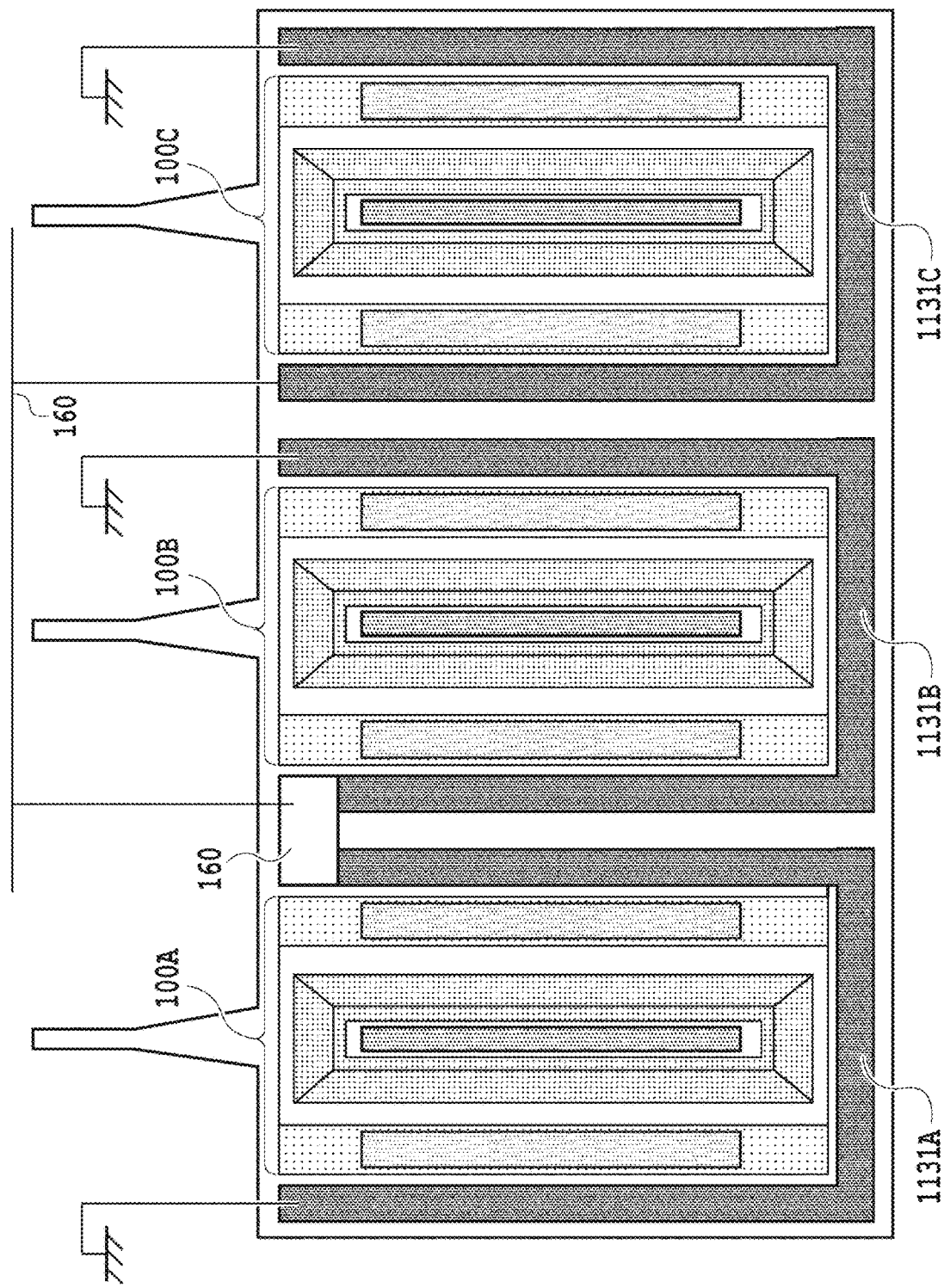
FIG. 16 is a plan view of a substrate of a photodetector according to Example 4 of the present invention.

FIG. 16 is a substrate plan view showing a configuration of a photodetector according to Example 4 of the present invention. Example 4 is an example in which one linear heater 1131 of Example 2 (FIG. 13) is divided into as many linear heaters 1131A, 1131B, and 1131C as the number of GePDs. Since the respective divided heaters are made with the same size and the same shape by the same process, are arranged adjacent to each other on a straight line, and share a power source, variation in resistance hardly occurs as in Example 2. Since a low-resistance metal electrode 160 is connected to one end of each of the divided linear heaters to feed power and the other end thereof is grounded, it is possible to efficiently apply heat to germanium layers of the respective GePD compared with Example 2.

EXAMPLE 5

Figure 17:
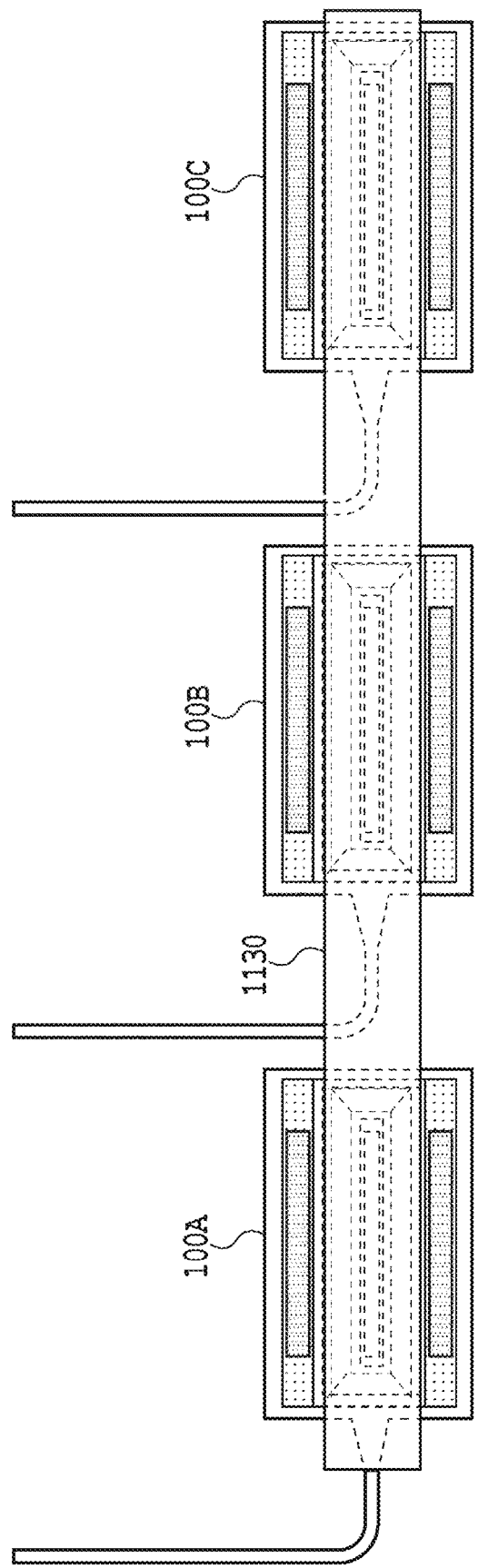
FIG. 17 is a plan view of a substrate of a photodetector according to Example 5 of the present invention.

FIG. 17 is a substrate plan view showing a configuration of a photodetector according to Example 5 of the present invention. In Examples 1 to 4, the optical axes of the respective GePDs are arranged to be parallel to each other on an extension of each input optical waveguide. However, in Example 5, optical axes of three GePDs 100A to 100C are aligned on one straight line, and one linear heater 1130 is arranged on the optical axis. In order to make such an arrangement, the input optical waveguides of the respective GePDs 100A to 100C include bent portions, respectively, and the respective GePDs are arranged on a straight line perpendicular to the optical input direction of the photodetector as a whole.

Generally, the germanium layer of the GePD includes a rectangular bottom surface having a long side parallel to the optical input axis. Accordingly, in the arrangement of Example 5, a width of the heater can be narrowed when the heat is arranged to cover the germanium, compared with Example 1 (FIG. 11). With such a narrowed heater, the resistance value per unit length increases, so that the heater can be driven with a lower current compared with Example 1. In the arrangement of Example 5, the heater made by ion implantation into the core layer 110 of the GePD may be used as in Example 2, or the heater may be divided for each GePD as in Example 3 or 4.

EXAMPLE 6

Figure 18:
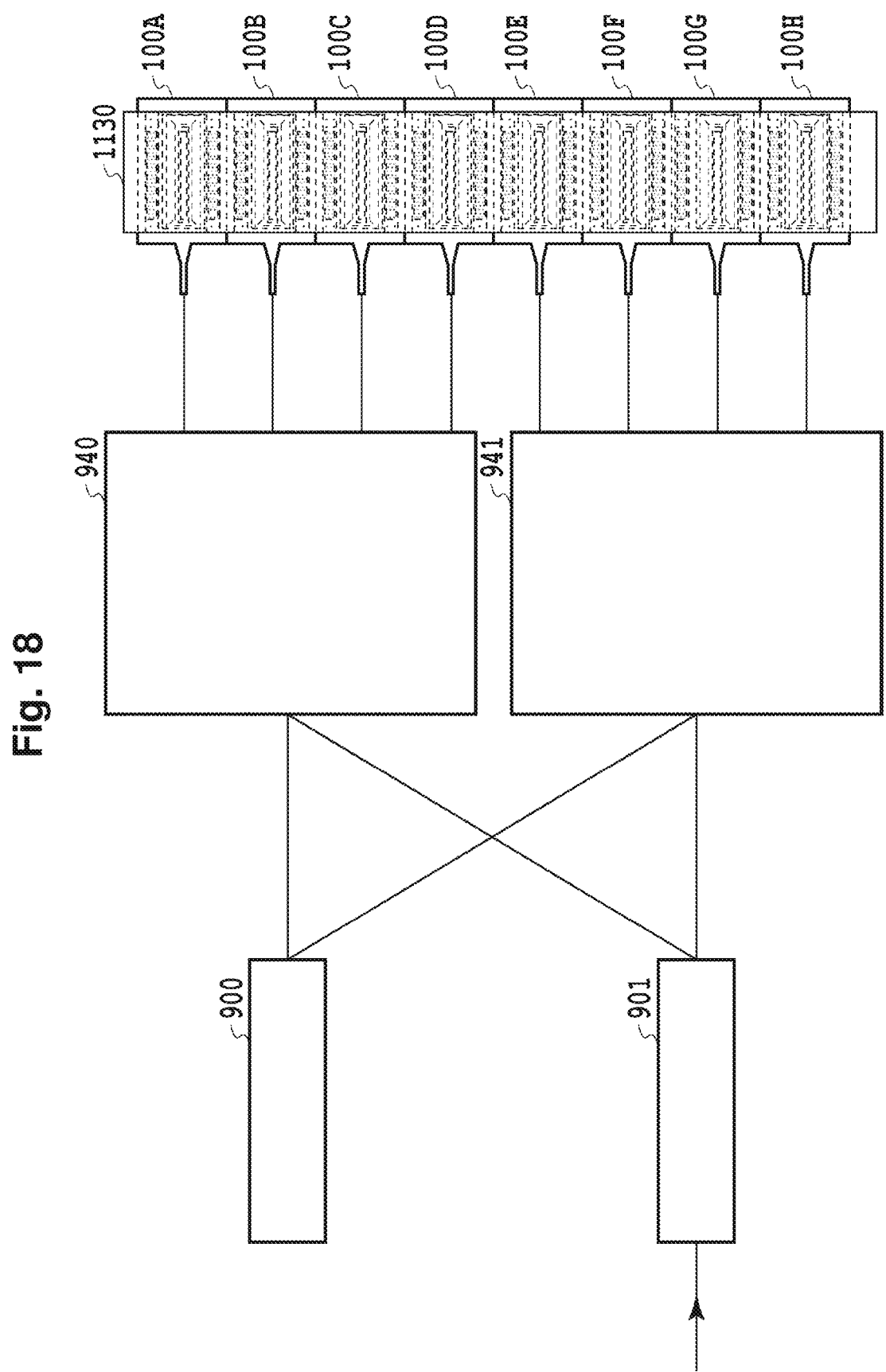
FIG. 18 is a view showing a configuration of an optical receiver according to Example 6 of the present invention.

FIG. 18 is a view showing a configuration of an optical receiver according to Example 6 of the present invention. The optical receiver of Example 6 is an example in which the group of GePDs 100A to 100C of the photodetector of Example 1 (FIG. 11) is applied to a receiver of an optical digital coherent communication technology and a group of GePDs 100A to 100H of the photodetector is formed. In order to efficiently apply the amount of heat from a common integrated heater 1130 to germanium layers 114A to 114H of the respective GePDs, the respective GePDs are arranged adjacent to each other. Optical paths connected to the respective GePDs 100A to 100H from optical hybrids 940 and 941 should have optically the same phase distance. In the arrangement of Example 6, each of the heaters may also be divided as in Example 3 (FIG. 15).

EXAMPLE 7

Figure 19:
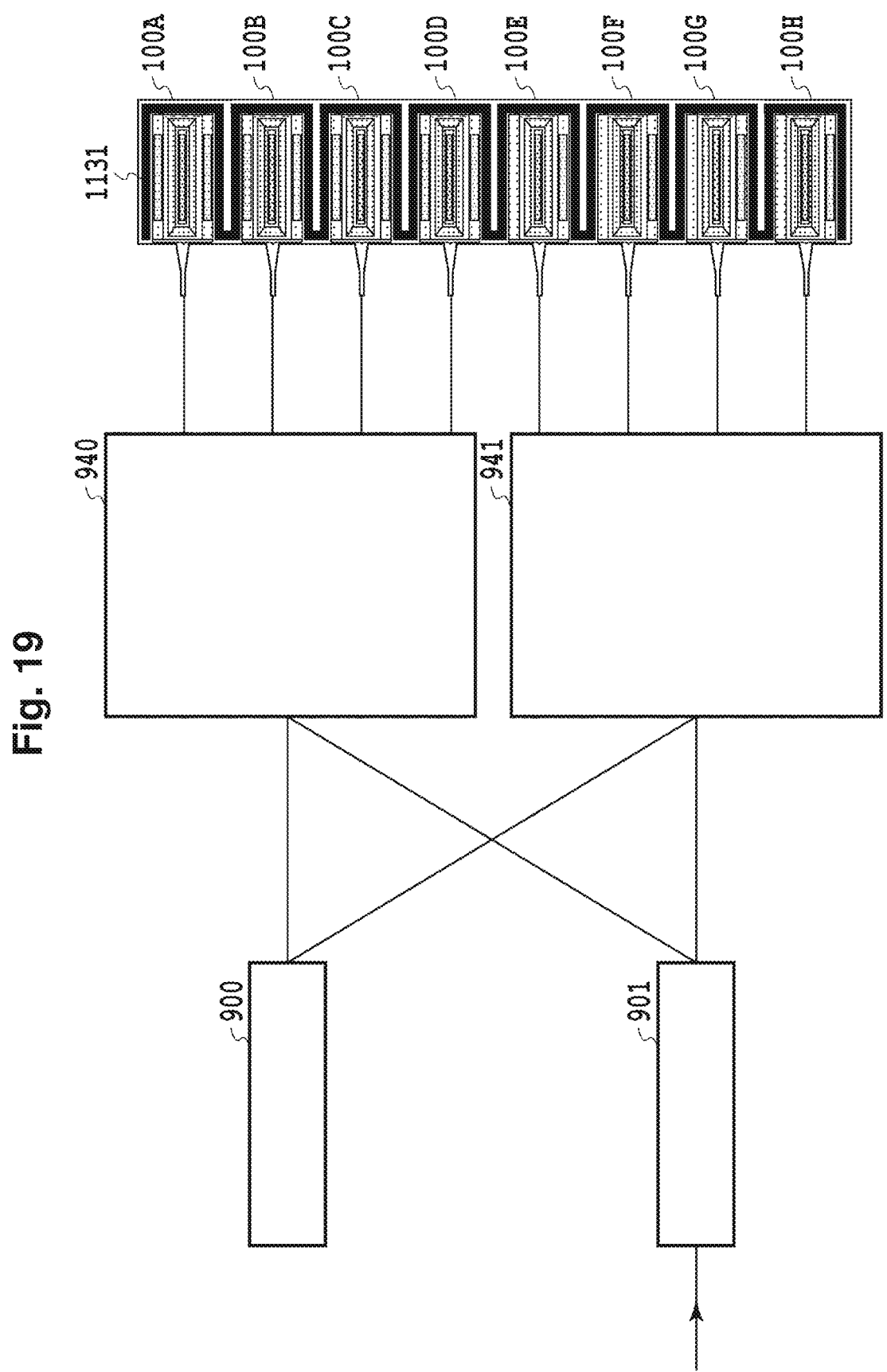
FIG. 19 is a view showing a configuration of an optical receiver according to Example 7 of the present invention.

FIG. 19 is a view showing a configuration of an optical receiver according to Example 7 of the present invention. The optical receiver of Example 7 is an example in which the group of GePDs 100A to 100C of the photodetector of Example 2 (FIG. 13) is applied to a receiver of an optical digital coherent communication technology and a group of GePDs 100A to 100H of the photodetector is formed. In order to efficiently apply the amount of heat from one heater 1131 to germanium layers 114A to 114H of the respective GePDs, the respective GePDs are arranged adjacent to each other. Optical paths leading to the respective GePDs 100A to 100H from optical hybrids 940 and 941 should have optically the same phase distance. In the arrangement of Example 7, each of the heaters may also be divided as in Example 4 (FIG. 16).

EXAMPLE 8

Figure 20:
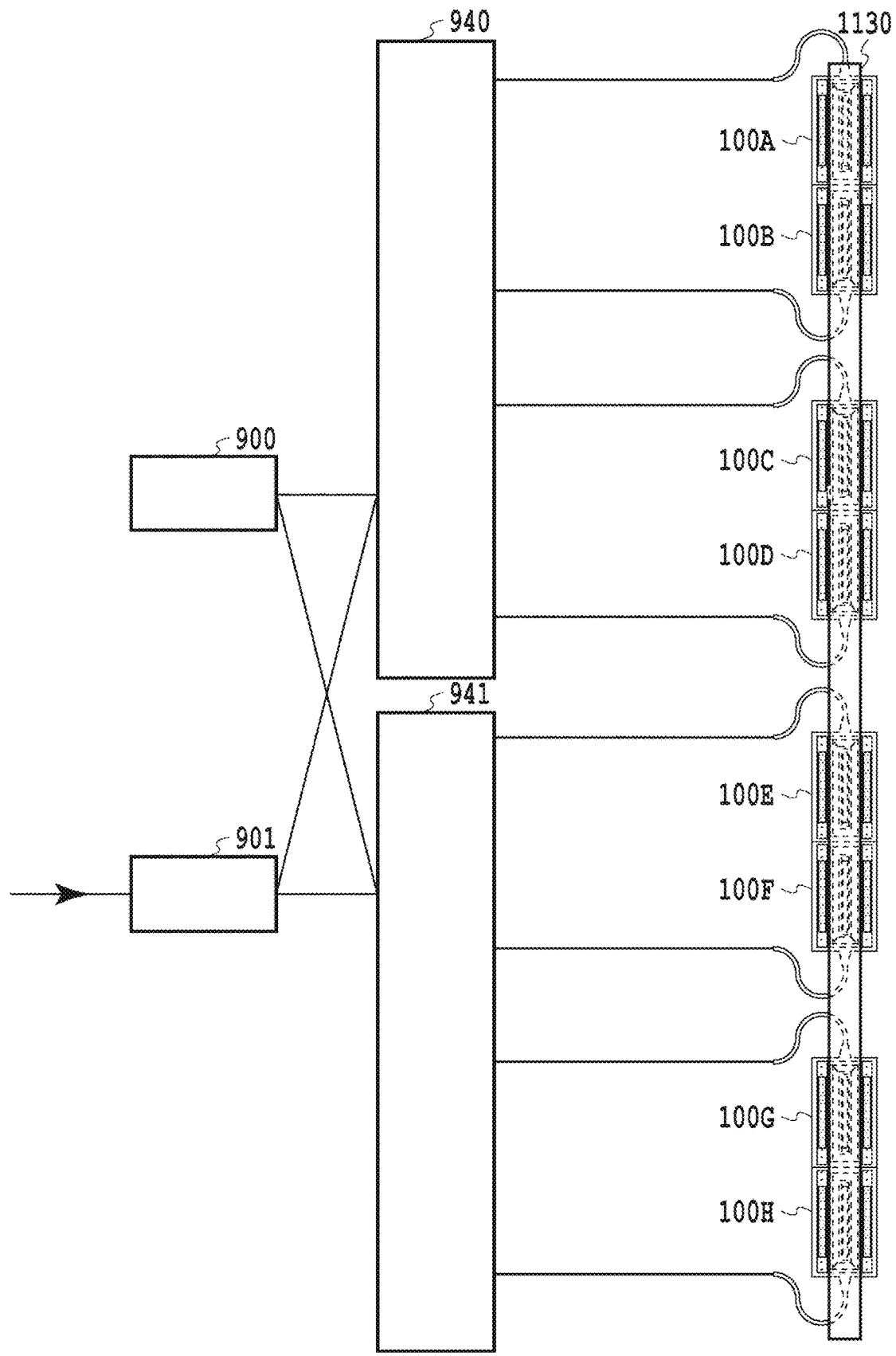
FIG. 20 is a view showing a configuration of an optical receiver according to Example 8 of the present invention.

FIG. 20 is a view showing a configuration of an optical receiver according to Example 8 of the present invention. The optical receiver of Example 8 is an example in which the group of GePDs 100A to 100C of the photodetector of Example 5 (FIG. 17) is applied to a receiver of an optical digital coherent communication technology and a group of GePDs 100A to 100H of the photodetector is formed. In order to efficiently apply the amount of heat from a heater 1130 to a germanium layer 114 of each of the respective GePDs 100, optical axes of the respective GePDs are arranged on a straight line, but can hardly be completely adjacent to each other due to a waveguide for optical input.

However, two GePDs (for example, 100A and 100B, 100C and 100D, 100E and 100F, or 100G and 100H) can be arranged back to back with each other to detect two paired optical outputs out of four optical outputs from the optical hybrid 940 and four optical outputs from the optical hybrid 941, and can be brought closer to each other by the input waveguide including the bent portions provided on opposite sides, thereby causing a more uniform temperature and making the optical sensitivity matching.

The optical paths leading from the optical hybrids 940 and 941 to the GePDs 100A to 100H should be optically the same phase distance. In the arrangement of this example, the heater made by ion implantation into the core layer 110 of the GePD may be used as in Example 2, or each of the heaters may be divided as in Examples 3 and 4.

EXAMPLE 9

Figure 21:
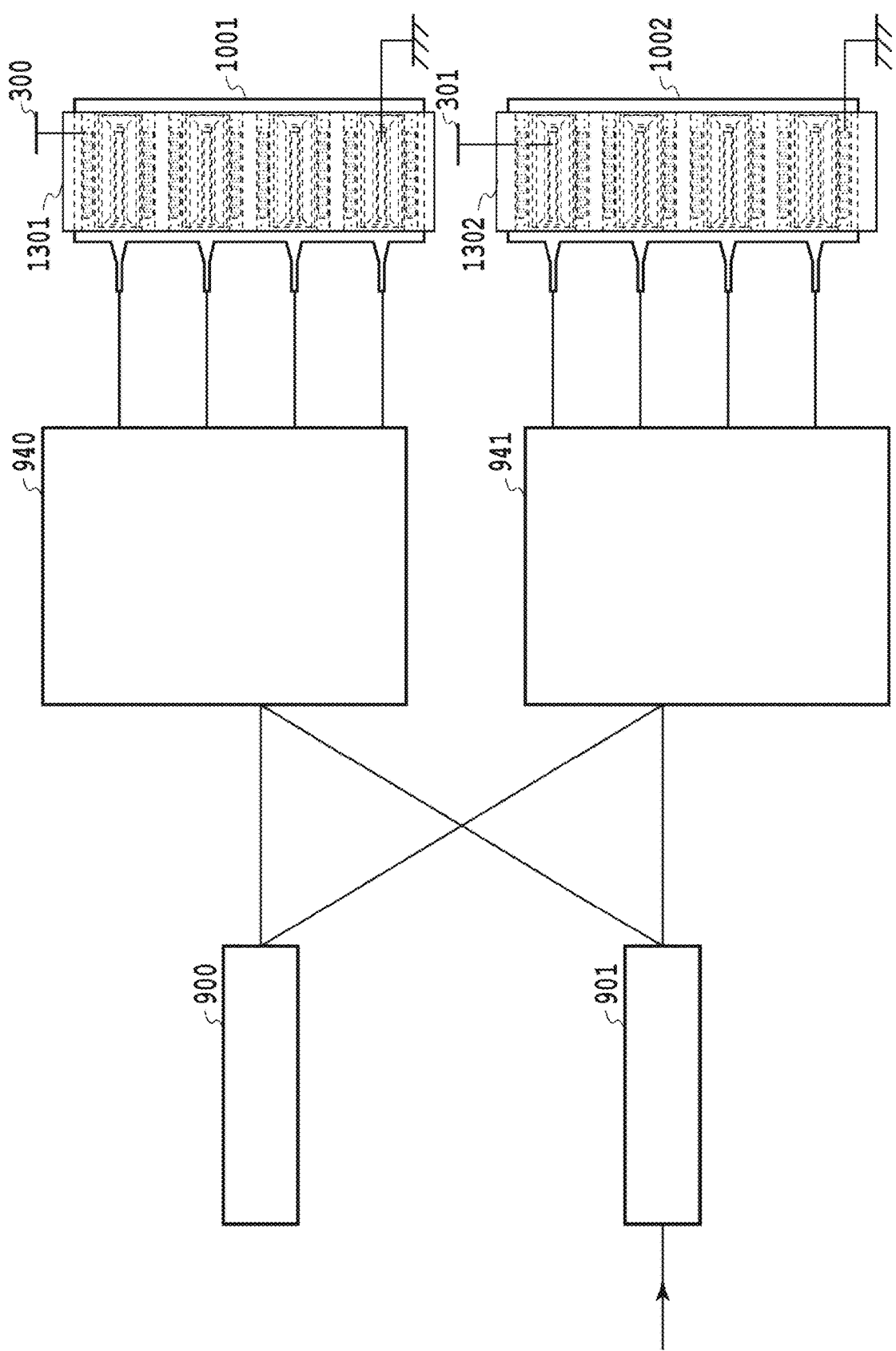
FIG. 21 is a view showing a configuration of an optical receiver according to Example 9 of the present invention.

FIG. 21 is a view showing a configuration of an optical receiver according to Example 9 of the present invention. The optical receiver of Example 9 is an example in which the group of GePDs 100A to 100C of Example 1 (FIG. 11) are applied to two GePD groups 1001 and 1002 of the photodetector of the receiver of the optical digital coherent communication technology. The respective GePDs are arranged adjacent to each other in order to efficiently apply the amount of heat from heaters 1301 and 1302 of the two GePD groups 1001 (GePDs 100A to 100D) and 1002 (GePDs 100E to 100H) to germanium layers of the respective GePDs.

In Example 9 of FIG. 21, optical hybrids 940 and 941 correspond to optical paths of X-polarization and Y-polarization. Since the optical paths of X-polarization and Y-polarization are optical paths in which independent optical signals are received, respectively, the optical sensitivity does not need to match between the two GePD groups connected to the optical paths, respectively. Independent heaters are arranged along with such a configuration, that is, the heater 1301 is arranged in the GePD group 1001 corresponding to the hybrid 940 and the heater 1302 is arranged in the GePD group 1002 corresponding to the hybrid 941, and power sources, for example, power sources 300 and 301 are also separate systems.

The entire GePD group 1001 connected to the hybrid 940 is subjected to the same temperature by the heater 1301, but such temperature is not always the same as the temperature of the GePD group 1002 connected to the hybrid 941. Since the heater is divided into two, the resistance value per heater is halved as compared with Example 6. For example, when the heaters 1301 and 1302 are driven in parallel, the heaters can be driven at a lower voltage compared with Example 6.

Similarly, this can be applied to the configurations of the GePD groups of Examples 2, 3, and 4 by separating the heater for each hybrid.

EXAMPLE 10

FIG. 22 is a view showing a configuration of an optical receiver according to Example 10 of the present invention. The optical receiver of Example 10 is an example in which the GePD groups 100A to 100C of Example 1 (FIG. 11) are applied to the GePD groups 100A to 100H of the photodetector of the receiver of the optical wavelength-division multiplexing communication technology. Wavelength-division multiplexing light input to a wavelength demultiplexer 150 is demultiplexed for each wavelength and is photoelectrically converted in each of the GePDs 100A to 100H. The respective GePDs are arranged adjacent to each other in order to efficiently apply the amount of heat from a heater 1130 to germanium layers of the respective GePDs. In Example 10, 8 channels of the photodetector are connected to outputs of the wavelength demultiplexer 150, but the number of channels may be any as long as being two or more. The same applies to the configurations of the GePDs of Examples 2, 3, and 4.

Industrial Applicability

In the present invention, it is possible to provide a GePD, the optical sensitivity of which is independent from the temperature in the C-band and the L-band of the optical wavelength, using the heater formed by the resistors having various shapes.

Furthermore, even in the photodetector in which a plurality of GePDs are provided, it is possible to achieve the photodetector in which the temperature of each of the GePDs can be made constant by keeping the heat given from the heater and the optical sensitivity is uniform.

REFERENCE SIGNS LIST 100, 100A to 100H, 950A to 950H Germanium photodetector (GePD)
1001, 1002 GePD group
101 Silicon (Si) substrate
102 Lower clad layer
103 Upper clad layer
110 (Silicon) core layer
111, 111A to 111C p-type Si slab
112, 112A to 112C, 113, 113A to 113C p++ Si electrode portion
114, 114A to 114C Germanium (Ge) layer
115, 115A to 115C n-type germanium (Ge) region
116, 116 to 116C, 117, 117A to 117C, 118, 118A to 118C Electrode
121 p-type germanium region
122 n-type germanium region
124p p-type silicon region
124n n-type silicon region
125 Silicon electrode portion
1101 Waveguide layer
1102 Silicon slab
130, 130A to 130C, 131, 1130, 1130A to 1130C, 1131, 1131A to 1131C, 1301, 1302 Resistor (heater)
160 Metal electrode
300, 301 Power source voltage
900 Local light-emitting source
901 Polarization divider
940, 941 Optical hybrid

The invention claimed is:

1. A photodetector comprising
germanium photoreceivers including:
a silicon substrate;
a lower clad layer formed on the silicon substrate;
a silicon core layer formed on the lower clad layer and including a silicon region doped with a first conductivity-type impurity;
a silicon waveguide layer connected to the silicon core layer;
a germanium layer formed on the silicon core layer and including a germanium region doped with a second conductivity-type impurity;
an upper clad layer formed on the silicon core layer and the germanium layer; and
electrodes connected to the silicon region and the germanium region, respectively, wherein
two or more germanium photoreceivers are arranged adjacent to each other on the silicon substrate,
the photodetector includes resistors embedded in the upper clad layer to cover respective germanium layers of the two or more germanium photoreceivers arranged adjacent to each other, the resistors being made of a metal or a metal compound, and
the resistors are provided as many as the number of germanium photoreceivers, the resistors are arranged on a straight line, the resistors are connected to each other by a metal electrode, and the respective resistors share a power source.

2. The photodetector according to claim 1, wherein the resistors are integrally formed to cover the germanium layers of all of the germanium photoreceivers.

3. The photodetector according to claim 2, wherein an input optical waveguide of each of the germanium photoreceivers includes a bent portion, and optical axes of the germanium photoreceivers are arranged to be placed on a straight line.

4. The photodetector according to claim 3, wherein the two germanium photoreceivers are arranged back to back to detect paired optical outputs such that the bent portions of the input optical waveguides are provided on opposite sides and adjacent to each other.

5. A photodetector comprising
germanium photoreceivers including:
a silicon substrate;
a lower clad layer formed on the silicon substrate;
a silicon core layer formed on the lower clad layer and including a silicon region doped with a first conductivity-type impurity;
a silicon waveguide layer connected to the silicon core layer;
a germanium layer formed on the silicon core layer and including a germanium region doped with a second conductivity-type impurity;
an upper clad layer formed on the silicon core layer and the germanium layer; and
electrodes connected to the silicon region and the germanium region, respectively, wherein
two or more germanium photoreceivers are arranged adjacent to each other on the silicon substrate,
the photodetector includes resistors formed by doping an impurity into the silicon core layer to surround respective germanium layers of the two or more germanium photoreceivers arranged adjacent to each other, and
the resistors are provided as many as the number of germanium photoreceivers, the resistors are arranged on a straight line, the resistors are connected to each other by a metal electrode, and the respective resistors share a power source.

6. The photodetector according to claim 5, wherein the resistors are integrally formed to surround the germanium layers of all of the germanium photoreceivers.

7. The photodetector according to claim 6, wherein an input optical waveguide of each of the germanium photoreceivers includes a bent portion, and optical axes of the germanium photoreceivers are arranged to be placed on a straight line.

8. The photodetector according to claim 7, wherein the two germanium photoreceivers are arranged back to back to detect paired optical outputs such that the bent portions of the input optical waveguides are provided on opposite sides and adjacent to each other.

9. The photodetector according to claim 5, wherein an input optical waveguide of each of the germanium photoreceivers includes a bent portion, and optical axes of the germanium photoreceivers are arranged to be placed on a straight line.

10. The photodetector according to claim 9, wherein the two germanium photoreceivers are arranged back to back to detect paired optical outputs such that the bent portions of the input optical waveguides are provided on opposite sides and adjacent to each other.

11. A photodetector comprising
germanium photoreceivers including:
a silicon substrate;
a lower clad layer formed on the silicon substrate;
a silicon core layer formed on the lower clad layer and including a silicon region doped with a first conductivity-type impurity;
a silicon waveguide layer connected to the silicon core layer;
a germanium layer formed on the silicon core layer and including a germanium region doped with a second conductivity-type impurity;
an upper clad layer formed on the silicon core layer and the germanium layer; and
electrodes connected to the silicon region and the germanium region, respectively, wherein
two or more germanium photoreceivers are arranged adjacent to each other on the silicon substrate,
the photodetector includes resistors embedded in the upper clad layer to cover respective germanium layers of the two or more germanium photoreceivers arranged adjacent to each other, the resistors being made of a metal or a metal compound,
the resistors are provided as many as the number of germanium photoreceivers, the resistors are arranged on a straight line, the resistors are connected to each other by a metal electrode, and the respective resistors share a power source, and
an input optical waveguide of each of the germanium photoreceivers includes a bent portion, and optical axes of the germanium photoreceivers are arranged to be placed on a straight line.

* * * * *